US007750765B2

(12) United States Patent
Kushta et al.

(10) Patent No.: US 7,750,765 B2
(45) Date of Patent: Jul. 6, 2010

(54) COMPACT VIA TRANSMISSION LINE FOR PRINTED CIRCUIT BOARD AND DESIGN METHOD OF THE SAME

(75) Inventors: Taras Kushta, Tokyo (JP); Kaoru Narita, Tokyo (JP); Takanori Saeki, Kawasaki (JP); Tomoyuki Kaneko, Kawasaki (JP); Hirokazu Tohya, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/249,273

(22) Filed: Oct. 10, 2008

(65) Prior Publication Data

US 2009/0091406 A1  Apr. 9, 2009

Related U.S. Application Data

(62) Division of application No. 10/558,888, filed as application No. PCT/JP2004/007915 on Jun. 1, 2004, now Pat. No. 7,463,122.

(30) Foreign Application Priority Data

Jun. 2, 2003  (JP) .............................. 2003-156862

(51) Int. Cl.
 *H03H 7/38* (2006.01)
 *H01P 1/04* (2006.01)
(52) U.S. Cl. .................... 333/260; 333/33; 174/250
(58) Field of Classification Search .................. 333/32, 333/33, 246, 238, 260; 174/250, 366
See application file for complete search history.

(56) References Cited

U.S. PATENT DOCUMENTS

| 5,451,720 A * | 9/1995 | Estes et al. .................. 174/250 |
| 6,388,206 B2 | 5/2002 | Dove et al. |
| 6,486,414 B2 | 11/2002 | Kobayashi et al. |

FOREIGN PATENT DOCUMENTS

| JP | 4-257287 | 9/1992 |
| JP | 6-37416 | 2/1994 |
| JP | 11-284414 | 10/1999 |
| JP | 2000-246510 | 8/2000 |
| JP | 2000-246510 | 9/2000 |
| JP | 2001-127439 | 5/2001 |

OTHER PUBLICATIONS

Chinese Patent Office issued a Chinese Office Action, Application No. 2004800152028.

* cited by examiner

*Primary Examiner*—Stephen E Jones
(74) *Attorney, Agent, or Firm*—Young & Thompson

(57) ABSTRACT

A compact via transmission line for a printed circuit board having preferred characteristic impedance and capable of miniaturizing the printed circuit board including a multilayer printed circuit board, and extending the frequency range of a via transmission line mounted on the printed circuit board, and a design method of the same. The transmission line has a central conductor forming an inner conductor layer boundary make up a signal via hole, a plurality of via holes arranged around the central conductor form an outer conductor layer boundary, and a plurality of conductor plates formed of a printed circuit board conductor layer, is further provided with a constitutive parameter adjustment clearance hole between the inner and outer conductor layer boundaries of the compact via transmission line, and electrically isolates to prevent cross-talk of a signal propagating through a signal via hole with other signals in a high-frequency signal band.

11 Claims, 31 Drawing Sheets

COMPACT VIA TRANSMISSION LINE FOR PRINTED CIRCUIT BOARD AND DESIGN METHOD OF THE SAME

TECHNICAL FIELD

The present invention relates to a compact via transmission line for a printed circuit board and a design method of the same, and in particular to a miniaturized compact via transmission line for a printed circuit board in which constitutive parameters of medium filling the clearance hole of the via transmission line such as relative permittivity and relative permeability are different from the constitutive parameter of an insulating layer comprising the printed circuit board, and a design method of the same.

BACKGROUND ART

For the purpose of more adequately describing a technological level for the present invention at present, all descriptions of the patents, patent applications, patent gazettes, scientific papers, and the like which are cited or specified in the present application will be incorporated herein by reference.

Interconnected circuits are very important for improvement in speeding up and packing density of a digital device and a communication device, and have a great effect on the electric characteristics of these devices. A printed circuit board including a multilayer board is cost-effective and convenient interconnect technology in which conductor layers which are mutually insulated by insulating layers are used for ground, power supply, and signals. This technology is particularly important in development and design of an interconnected circuit such as a planar transmission line including a micro-strip line, a strip line, a coplanar line, and a slot line as well as via transmission lines.

Conventionally, there has been proposed that ground via holes connected to ground plates are provided on a multilayer board to prevent an unnecessary propagation mode being produced by a high frequency signal leaked in a via structure through a insulating layer held between conductor plates. This prior art is disclosed in, for example, the Japanese Unexamined Patent Publication No. 9(1997)-321501.

In addition, the art that a coaxial line of predetermined impedance is formed to reduce a signal attenuation by forming the coaxial line of the predetermined impedance from a metal plate, an insulator, and a metal pin on a printed circuit board to permit the passage of a high-frequency signal therethrough is disclosed in, for example, the Japanese Unexamined Patent Publication No. 6(1994)-104601.

Furthermore, such an art that via holes for shielding electromagnetic waves are arranged on all sides so that the distance between each via hole is less than ½ of an effective wavelength to prevent the occurrence of resonance is disclosed in, for example, the Japanese Unexamined Patent Publication No. 2001-68596.

As described in the above patent gazettes, a typical example of an interconnection in a direction perpendicular to a printed circuit board includes a via hole structure. Simple via holes formed on the printed circuit board produce parasitic oscillation in an insulating layer comprising the printed circuit board to generate unnecessary electromagnetic radiation from the printed circuit board. For this reason, as described in Patent Document 3, the method using the ground via hole as the barrier is being carried out to avoid the effects of such unnecessary radiation.

However, while it is essential to accurately carry out impedance matching with respect to a via transmission line comprising one signal via hole and the barrier of the ground via holes in a case where the composite via transmission line is miniaturized, the fact is that a difficult problem that inevitably arises occurs.

DISCLOSURE OF THE INVENTION

It is therefore a primary object of the present invention to achieve a miniaturized via transmission line with preferred characteristic impedance suitable for high-density mounting, as well as to extend the frequency range of a via transmission line in a printed circuit board including a multilayer printed circuit board.

It is other and further objects of the invention of the present application to aim at miniaturization of an interconnected circuit and a printed circuit board, as well as to achieve desired characteristic impedance by forming so that a constitutive parameter of medium filling the clearance hole of a via transmission line, for example, relative permittivity or relative permeability, differs from corresponding constitutive parameter of an insulating layer for insulating between conductor layers of the printed circuit board.

A first aspect of the present invention is a compact via transmission line for a printed circuit board provided on the printed circuit board, wherein said compact via transmission line comprises a central conductor which forms an inner conductor boundary of said compact via transmission line, and through which a signal transmits, a plurality of ground via holes which form an outer conductor boundary of said compact via transmission line, a ground plate formed of a conductor layer of said printed circuit board connected to said ground via holes, and a constitutive parameter adjustment via hole provided between said inner conductor boundary and said outer conductor boundary to adjust a constitutive parameter of said printed circuit board, and wherein said constitutive parameter adjustment via hole is filled with a uniform medium or a composite medium having a second constitutive parameter different from a first constitutive parameter of an insulating layer comprising said printed circuit board.

It is desirable that said printed circuit board be a multilayer printed circuit board having a plurality of conductor layers.

It is desirable that said first and second constitutive parameters be at least any one of relative permittivity and relative permeability.

It is desirable that said compact via transmission line be impedance-matched to an interconnected circuit mounted on said printed circuit board and connected to said compact via transmission line.

It is desirable that the value of relative permittivity of said second constitutive parameters be smaller than the value of relative permittivity of said first constitutive parameters.

Said ground via holes may be arranged on a circumference, said ground via holes may also be arranged in a square.

A second aspect of the present invention is a compact via transmission line for a printed circuit board provided on the printed circuit board, wherein said compact via transmission line comprises a central conductor which forms an inner conductor boundary of said compact via transmission line, and through which a signal transmits, a plurality of ground via holes which form an outer conductor boundary of said compact via transmission line, a ground plate formed of a conductor layer of said printed circuit board connected to said ground via holes, a constitutive parameter adjustment via hole provided between said inner conductor boundary and said outer conductor boundary to adjust a constitutive parameter of said printed circuit board, and air vents provided between said inner conductor boundary and said outer conductor boundary so as to excavate said printed circuit board.

It is desirable that said air vents be provided on said printed circuit board so as to adjust the characteristic impedance of a via transmission line provided on said printed circuit board and an interconnected circuit connected to the via transmission line.

Said air vents may have of at least two different sized round shapes.

Said air vents may be irregularly arranged between said inner conductor boundary and said outer conductor boundary.

Said air vents may be arranged to be symmetric with respect to said signal via hole.

It is desirable that the maximum length of the cross-sectional shapes of said air vents be not more than ⅛ of the minimum wavelength in a predetermined frequency range of a signal propagating through an insulating layer of said printed circuit board.

Said ground via holes may be arranged on a circumference, said ground via holes may also be arranged in a square.

It is desirable that the electric field and the magnetic field of a principal electromagnetic wave propagating on said printed circuit board be in a direction perpendicular to a propagation direction, the electric field and the magnetic field being at right angles to each other.

A third aspect of the present invention is a compact via transmission line for a printed circuit board provided on the printed circuit board, wherein said compact via transmission line comprises two central conductors which form two inner conductor boundaries of said compact via transmission line, and through which differential signals transmit, a plurality of ground via holes which form two outer conductor boundaries each arranged around said two central conductors, ground plates formed of conductor layers of said printed circuit board connected to said ground via holes, and two constitutive parameter adjustment via holes provided between said two inner conductor boundaries and said two outer conductor boundaries to adjust constitutive parameters of said printed circuit board, and wherein said two constitutive parameter adjustment via holes are each filled with a uniform medium or a composite medium having a second constitutive parameter different from a first constitutive parameter of an insulating layer comprising said printed circuit board.

A fourth aspect of the present invention is a design method of a compact via transmission line for a printed circuit board comprising a central conductor which forms an inner conductor boundary of the compact via transmission line for the printed circuit board provided on the printed circuit board, and through which a signal transmits, a plurality of ground via holes which form an outer conductor boundary of said compact via transmission line, and a ground plate formed of a conductor layer of said printed circuit board connected to the ground via holes, wherein a constitutive parameter adjustment via hole for adjusting a constitutive parameter of said printed circuit board is provided between said inner conductor boundary and said outer conductor boundary, said constitutive parameter adjustment via hole being filled with a uniform medium or a composite medium having a second constitutive parameter different from a first constitutive parameter of an insulating layer comprising said printed circuit board.

It is desirable that the value of relative permittivity of said second constitutive parameters be smaller than the value of relative permittivity of said first constitutive parameters.

It is desirable that said first and second constitutive parameters be at least any one of relative permittivity and relative permeability.

It is desirable that said compact via transmission line be Impedance-matched to an interconnected circuit mounted on said printed circuit board and connected to said compact via transmission line.

A fifth aspect of the present invention is a design method of a compact via transmission line for a printed circuit board comprising a central conductor which forms an inner conductor boundary of the compact via transmission line for the printed circuit board provided on the printed circuit board, and through which a signal transmits, a plurality of ground via holes which form an outer conductor boundary of said compact via transmission line, and a ground plate formed of a conductor layer of said printed circuit board connected to the ground via holes, wherein a constitutive parameter adjustment via hole for adjusting a constitutive parameter of said printed circuit board is provided between said inner conductor boundary and said outer conductor boundary, and air vents are further formed between said inner conductor boundary and said outer conductor boundary so as to excavate said printed circuit board.

It is desirable that said air vents be provided on said printed circuit board so as to adjust the characteristic impedance of a via transmission line provided on said printed circuit board and an interconnected circuit connected to the via transmission line.

It is desirable that the electric field and the magnetic field of a principal electromagnetic wave propagating on said printed circuit board be in a direction perpendicular to a propagation direction, the electric field and the magnetic field being at right angles to each other.

It is desirable that the maximum length of the cross-sectional shapes of said air vents be not more than ⅛ of the minimum wavelength in a predetermined frequency range of a signal propagating through an insulating layer of said printed circuit board.

BEST MODE FOR CARRYING OUT THE INVENTION

Hereinafter, an overview of the embodiment of the present invention will be described.

The compact via transmission line according to the present invention has a central conductor which forms an inner conductor layer boundary of the compact via transmission line, a plurality of ground via holes arranged around the signal via and a set of ground plates from conductor layers of a printed circuit board to form an outer conductor boundary of the compact via transmission line, and a constitutive parameter adjustment via hole for electrically isolating the inner conductor boundary from the outer conductor boundary which have differential potentials. This constitutive parameter adjustment via hole may be filled with a composite material made of a uniform substance or a plurality of different substances. A particular example includes a method of forming air vents between a signal via and ground via holes of a via transmission line to adjust a constitutive parameter of a printed circuit board.

A filling medium for filling the constitutive parameter adjustment via hole of the present invention is usually selected in such a way that the characteristic impedance of this compact via transmission line and a circuit mounted on a printed circuit board and connected to the compact via transmission line is matched along with miniaturization of the printed circuit board. The printed circuit board may be miniaturized by selecting so that either or both constitutive parameters of a medium material having filled the constitutive parameter adjustment via hole, or either or both relative permittivity and relative permeability of the air vents differ from constitutive parameters corresponding to an insulating layer comprising the printed circuit board, thus allowing packing density to be improved. In addition, the printed circuit board using the via transmission line of the present invention is operable at a wide frequency band, so that a high-speed digital signal can be transmitted.

Next, the embodiment of the present invention will be described in detail with reference to the drawings.

While a description will be given of a compact via transmission line essentially including one signal via hole in the following embodiments, it is to be understood that the invention of the present application is not intended to be limited to the compact via transmission line, and is easily applicable to any plurality of signal via holes in a compact via transmission line mounted on a printed circuit board, for example, as a pair of signal via holes.

Any number of the compact via transmission lines in which via holes are arranged in a complicated and high density state may be used to connect any kinds of interconnected circuits such as planar transmission lines. The compact via transmission line according to the invention of the present application is also applicable to a multilayer printed circuit board having any transmission lines.

Figure 1A:
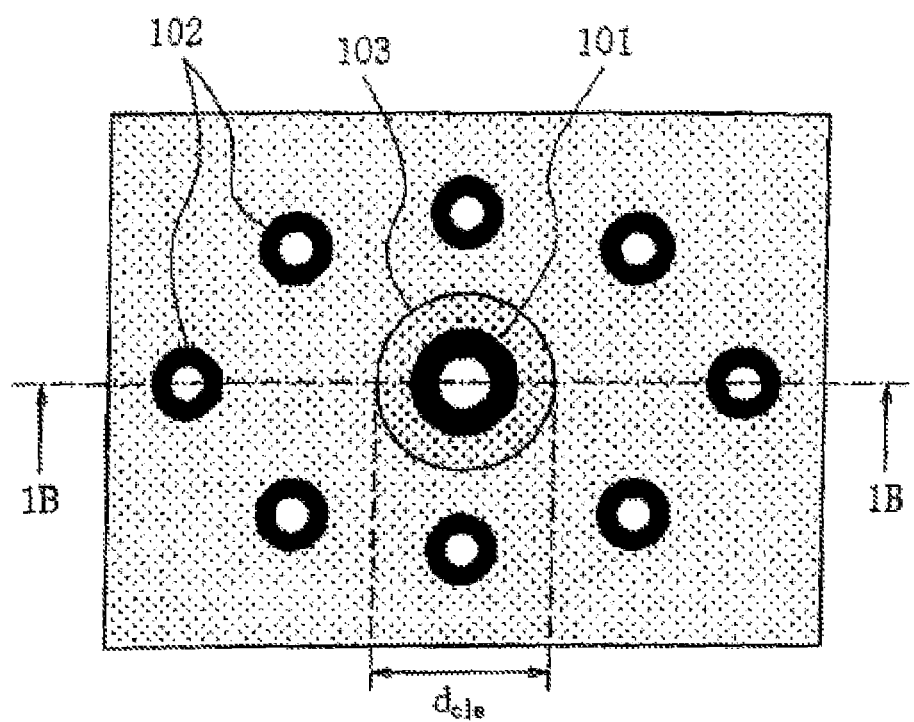
FIG. 1A is a plan view showing a compact via transmission line according to the invention of the present application in a printed circuit board.
Figure 1B:
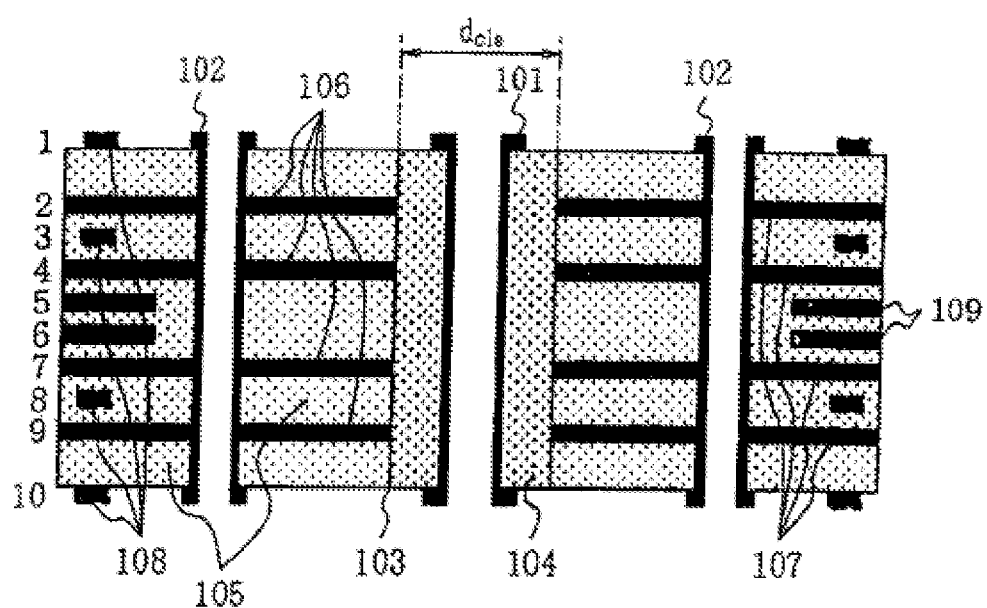
FIG. 1B is a longitudinal sectional view showing the compact via transmission line according to the invention of the present application in the printed circuit board.

FIG. 1A and FIG. 1B are a plan view and a longitudinal sectional view showing the compact via transmission line according to the invention of the present application in a printed circuit board. With reference to FIG. 1A and FIG. 1B, there is shown an example of the compact via transmission line formed on a multilayer printed circuit board made up of conductor layers 1 to 10 with 10 layers as a design example of the multilayer printed circuit board. Ground lines 107, signal lines 108, and power supply lines 109 are formed by the conductor layers 1 to 10 insulated by insulating layers 105 in the multilayer printed circuit board. The compact via transmission line comprises a central conductor 101, ground via holes 102 arranged around the central conductor 101, ground plates 106 from the conductor layers 106, and a constitutive parameter adjustment via hole 103 having a diameter of dcle filled with a filling medium 104. Constitutive parameters of the filling medium 104, for example, either or both of the relative permittivity and the relative permeability are selected so as to differ from corresponding constitutive parameters of insulating layers 105 in order to satisfy both of the miniaturization and characteristic impedance matching to an interconnected circuit. More specifically, the energy of an electromagnetic wave signal incoming from a circuit linked to the compact via transmission line will be partially returned by reflection in the linked point, but the reflection may be extremely reduced by adjusting the dimension of the compact via transmission line, and either or both of the values of the relative permittivity and the relative permeability, thereby making it possible to transmit a signal with little or no attenuation of signal amplitude.

Additionally, in a case where there are many ground via holes forming the outer conductor boundary of the via transmission line to the extent that the distance between adjacent ground via holes is enough smaller than $\lambda/4$ ($\lambda$ is the minimum wavelength of a propagation signal in the insulating layers of the printed circuit board in a predetermined frequency range), this via transmission line may be considered as well enough insulated transmission line. The outer boundary of the via transmission line including the ground via holes may also be considered as the boundary formed of approximately continuous conductor surface. The characteristic impedance of the via transmission line may be calculated at a good approximation by regarding the inner and outer boundaries formed of the continuous conductor surfaces as in corresponding coaxial transmission line, and a signal wave as traveling along these boundaries.

Some typical geometric shapes and arrangements relating to the via transmission line will be considered in order to explain physical basis conditions for miniaturization of the via transmission line mounted on the printed circuit board.

Figure 2A:
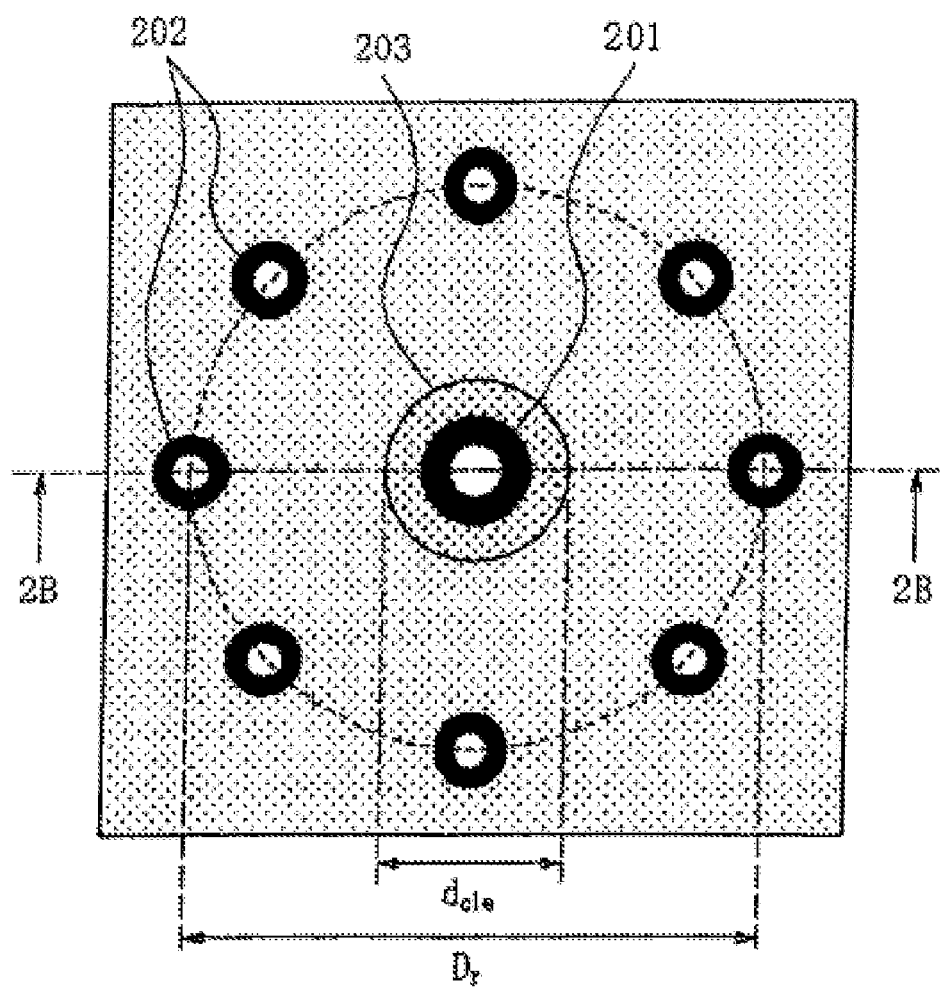
FIG. 2A is a plan view showing a compact via transmission line according to the invention of the present application in which ground via holes are arranged on a circumference in a printed circuit board.
Figure 2B:
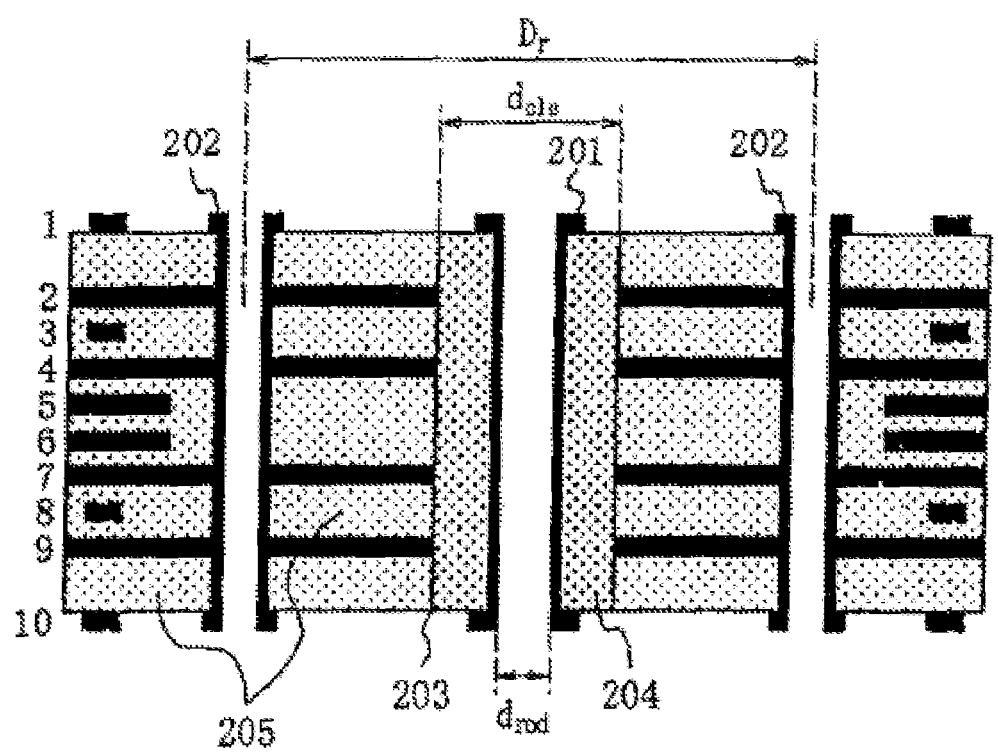
FIG. 2B is a longitudinal sectional view showing the compact via transmission line according to the invention of the present application in which the ground via holes are arranged on a circumference in the printed circuit board.

FIG. 2A and FIG. 2B are a plan view and a longitudinal sectional view showing the compact via transmission line according to the invention of the present application, in which ground via holes are arranged on a circumference in a printed circuit board. With reference to FIG. 2A and FIG. 2B, the basic structure of the via transmission line shown in FIG. 2A and FIG. 2B are identical to the structure shown in FIG. 1A and FIG. 1B except that ground via holes 202 are arranged on a circumference with a focus on a central conductor 201, and yet at even intervals. If insulating layers 205 used to insulate conductor layers used in the printed circuit board to each other are identical to a filling medium 204 of a constitutive parameter adjustment via hole 203, the characteristic impedance of this via transmission line may be approximated by the following well-known (1) formula used when a signal wave travels between continuous inner and outer conductor boundaries on a circumference:

$$Z_r \approx 60 \cdot \sqrt{\frac{1}{\varepsilon}} \cdot \ln\left(\frac{R_r}{r_{rod}}\right) \tag{1}$$

where Zr is the characteristic impedance of the via transmission line, $R_r = D_r/2$ being the distance between the center of the ground via hole and the center of the central conductor, $r_{rod} = d_{rod}/2$ being the radius of the central conductor, $\varepsilon$ is the relative permittivity of the insulating layers 205, and the relative permeability of insulating material 205 is equal to 1.

It is indispensable for the compact via transmission line according to the invention of the present application that the relative permittivity of the filling medium 204 for filling the constitutive parameter adjustment via hole 203 with a diameter of $d_{cle}$ differs from the relative permittivity of the insulating layers 205 comprising the printed circuit board.

Accordingly, in this case, the characteristic impedance of the via transmission line mounted on the printed circuit board is calculated based on effective relative permittivity determined from both of the relative permittivity of the filling medium 204 having filled the constitutive parameter adjustment via hole 203 and the relative permittivity of the insulating layers 205 of the printed circuit board. This effective relative permittivity is found by well-known theory and experimental methods. If the relative permittivity of the filling medium 204 having filled the constitutive parameter adjustment via hole of the compact via transmission line is smaller than the relative permittivity of the insulating layers 205, the effective relative permittivity of the via transmission line becomes smaller than the relative permittivity of the insulating layers 205.

With this, if a via transmission line in which materials of the filling medium 204 and the insulating layers 205 are identical is compared with the compact via transmission line according to the invention of the present application described above, the cross-sectional area of the compact via transmission line according to the invention of the present application becomes smaller than the cross-sectional area of the via transmission line in which the materials of the filling medium 204 and the insulating layers 205 are identical since the characteristic impedance of the two via transmission lines are equal, and yet parameters other than the filling medium having filled the constitutive parameter adjustment via hole are equal.

As can be seen from the foregoing, the characteristic impedance of the compact via transmission line in which the ground via holes 202 shown in FIG. 2A and FIG. 2B are arranged on a circumference is represented by the following (2) formula.

$$Z_{CVT,r} \approx 60 \cdot \sqrt{\frac{1}{\varepsilon_{\textit{eff}}}} \cdot \ln\left(\frac{R_r}{r_{rod}}\right) \quad (2)$$

where, ZCVT,r is the characteristic impedance of the compact via transmission line, εeff being effective relative permittivity determined from both of the insulating layers 205 and the filling medium 204 having filled the constitutive parameter adjustment via hole.

As can be seen from the (2) formula, if the relative permittivity of the filling medium having filled the constitutive parameter adjustment via hole is reduced, the effective relative permittivity is reduced, and the distance Rr is inevitably reduced to keep the characteristic impedance constant, for example, 50 ohms. This provides design policy for developing a compact via transmission line. Thus, in order to achieve the miniaturization of the via transmission line of the printed circuit board, it is important to select so that the relative permittivity of the insulating layers filling the constitutive parameter adjustment via hole is reduced more than the relative permittivity of the insulating materials insulating the conductor layers of the printed circuit board.

Figure 3A:
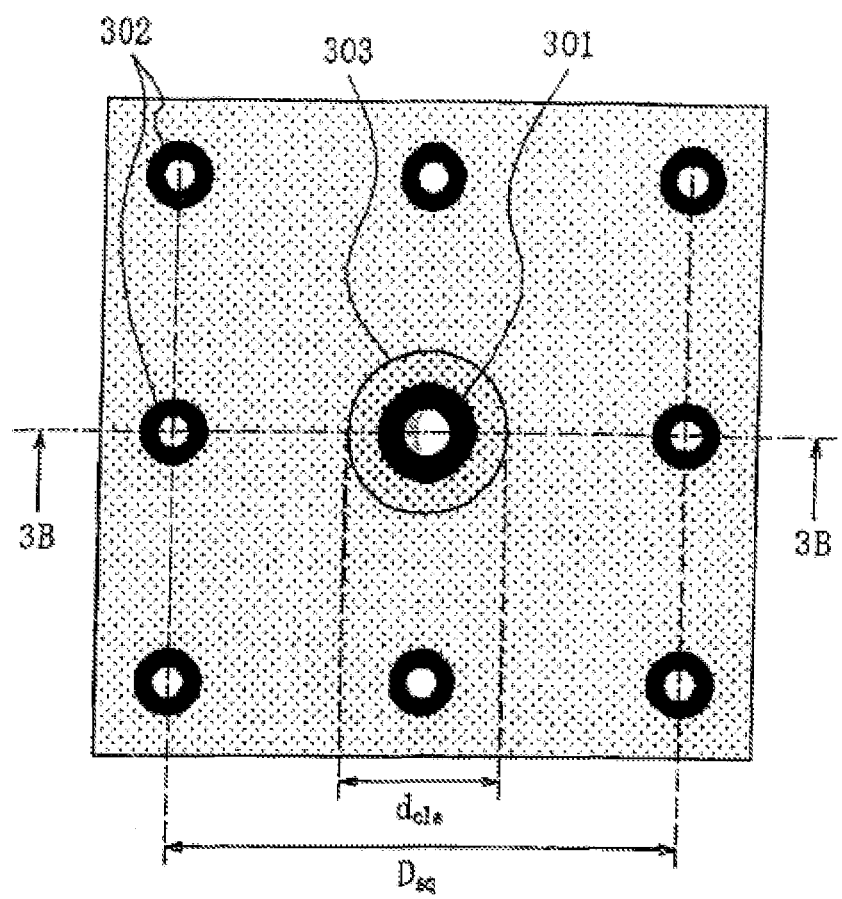
FIG. 3A is a plan view showing a compact via transmission line according to the invention of the present application in which ground via holes are arranged in a square in a printed circuit board.
Figure 3B:
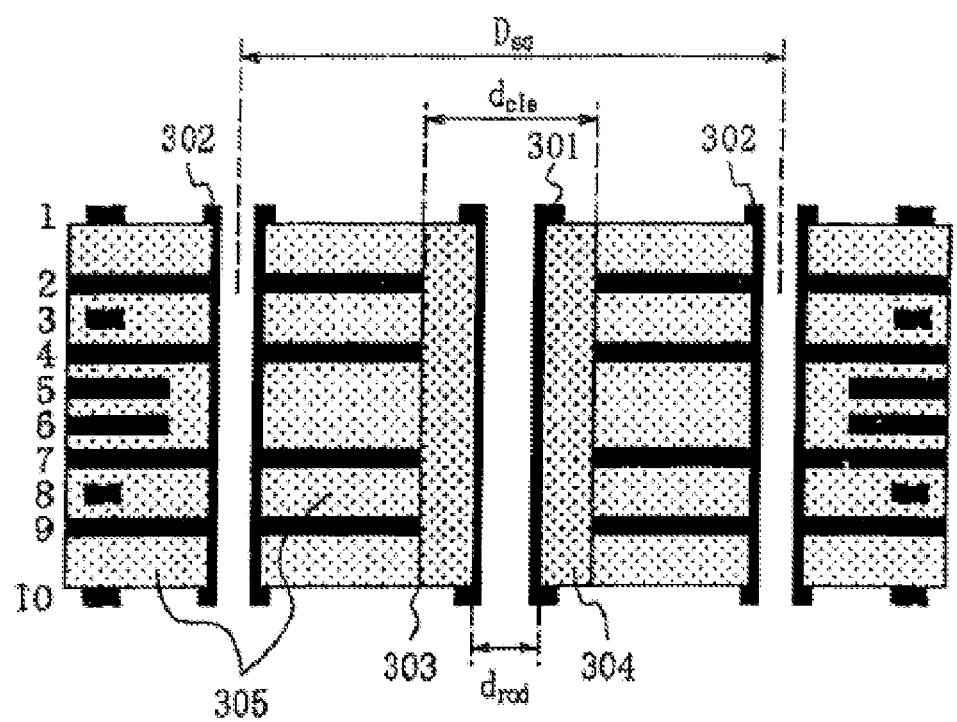
FIG. 3B is a longitudinal sectional view showing the compact via transmission line according to the invention of the present application in which the ground via holes are arranged in a square in the printed circuit board.

FIG. 3A and FIG. 3B are a plan view and a cross-sectional view showing a compact via transmission line in a printed circuit board, in which ground via holes 302 are arranged in a square around a central conductor 301. The compact via transmission line is shown as if it was incorporated into the printed circuit board in a manner similar to FIG. 1A and FIG. 1B for convenience of explanation.

If a constitutive parameter adjustment via hole 303 with a diameter of $d_{cle}$ comprising the compact via transmission line is filled with the same materials as those of insulating layers for insulating conductor layers of the printed circuit board, the characteristic impedance of a via transmission line may be approximated by the following well-known (3) formula used when a signal wave travels between the inner conductor boundary and outer square-continued conductor boundary.

$$Z_{sq} \approx 60 \cdot \sqrt{\frac{1}{\varepsilon}} \cdot \ln\left(\frac{1.0787 \cdot R_{sq}}{r_{rod}}\right) \quad (3)$$

where, $Z_{sq}$ is the characteristic impedance of the compact via transmission line, $R_{sq}=D_{sq}/2$ being the distance between the ground via hole closest to the central conductor among the ground via holes forming the outer conductor boundary and the signal via, $r_{rod}=d_{rod}/2$ being the radius of the central conductor, ε is the relative permittivity of insulating layers 305, with the relative permeability of the insulating layers 305 as 1.

It is necessary that the relative permittivity of a filling medium 304 filling the constitutive parameter adjustment via hole 303 be made smaller than the relative permittivity of the insulating layers 305 insulating the conductor layers of the printed circuit board in order to form the compact via transmission line on the printed circuit board. In this case, the characteristic impedance of the compact via transmission line in which the ground via holes shown in FIG. 3A and FIG. 3B are arranged in a square is represented by the following (4) formula.

$$Z_{CVT,r} \approx 60 \cdot \sqrt{\frac{1}{\varepsilon_{\textit{eff}}}} \cdot \ln\left(\frac{1.0787 \cdot R_{sq}}{d_{rod}}\right) \quad (4)$$

where ZCVT,r is the characteristic impedance of the compact via transmission line, εeff being effective relative permittivity determined from both of the insulating layers 305 and the filling medium 304 having filled the constitutive parameter adjustment via hole.

The conclusion from the consideration for the compact via transmission line using the ground via holes arranged in a square is identical to the conclusion obtained from the compact via transmission line using the ground via holes arranged on a circumference. More specifically, it is possible to miniaturize the compact via transmission line by reducing the relative permittivity of the filling medium filling the constitutive parameter adjustment via hole. In this way, the aforementioned two embodiments are based on design concept that the ground via holes are formed around the central conductor, and formed so that the filling medium filling the constitutive parameter adjustment via hole differs from the insulating materials for insulating the conductor layers of the printed circuit board.

A particular and very important method in forming a composite medium is the one using air vents to form the filling medium filling the constitutive parameter. This is because the composite medium using the air vents is suitable for use in comprising the compact via transmission line from the fact that the relative permittivity and the relative permeability of air are virtually 1.

Figure 4A:
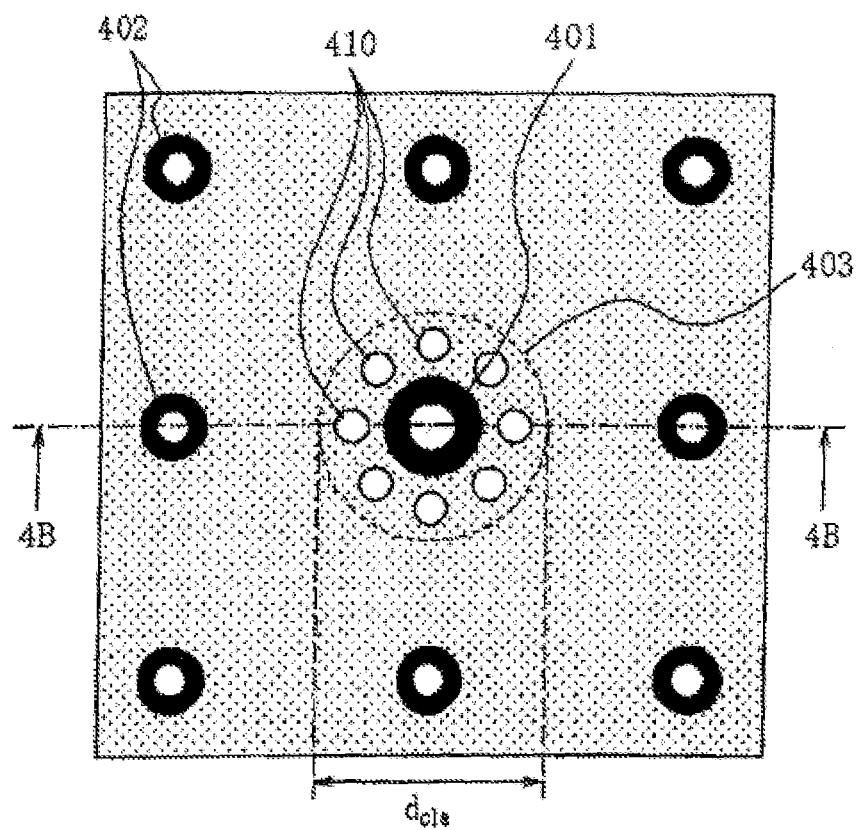
FIG. 4A is a plan view showing a compact via transmission line according to the invention of the present application in which air vents are formed in the area of a constitutive parameter adjustment via hole of the compact via transmission line in a printed circuit board.
Figure 4B:
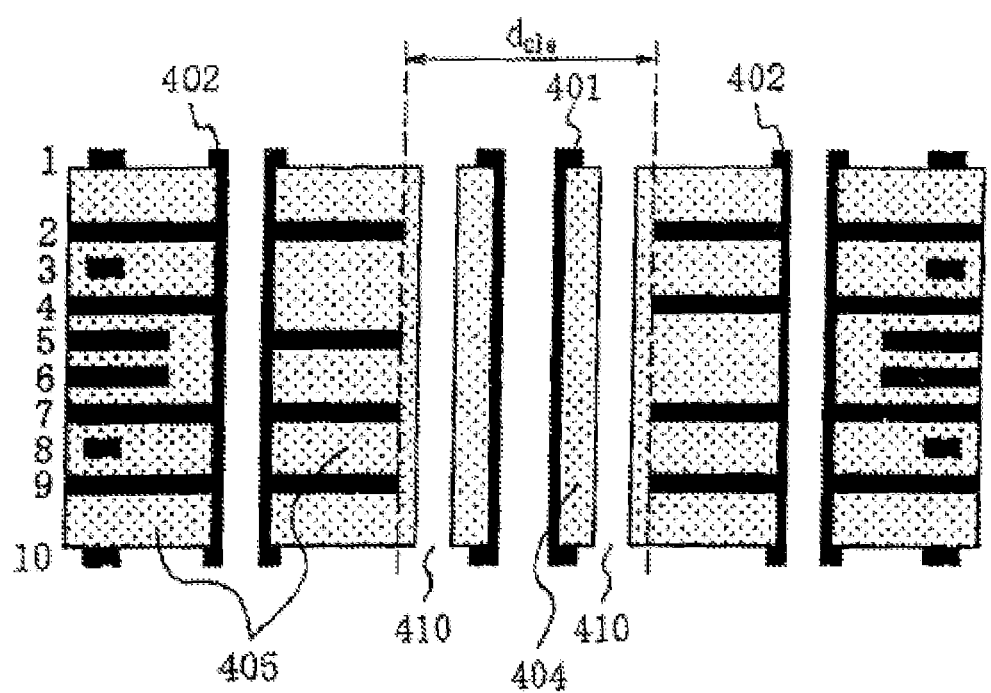
FIG. 4B is a longitudinal sectional view showing the compact via transmission line according to the invention of the present application in which the air vents are formed in the area of the constitutive parameter adjustment via hole of the compact via transmission line in the printed circuit board.

Hereinafter, an embodiment in which the compact via transmission line is formed by the use of air vents will be described. FIG. 4A and FIG. 4B are each a plan view and a cross-sectional view showing a compact via transmission line having ground via holes 402 arranged in a square around a central conductor 401. In this compact via transmission line, a composite insulator 404 having filled a constitutive parameter adjustment via hole 403 is formed so that the relative permittivity of the composite insulator 404 is smaller than the relative permittivity of insulating layers 405 for insulating the conductor layers of the printed circuit board, and in which air vents are provided so as to excavate the insulating layers 405 in the area of the constitutive parameter adjustment via hole 403 in structure. Here, the conductor layer arrangement of the printed circuit board has the same structure as those shown in FIG. 1A and FIG. 1B. Air vents 410 provided so as to excavate the insulating layers 405 form such a composite medium of the constitutive parameter adjustment via hole 403 that the relative permittivity thereof can be regarded as being effectively smaller than the relative permittivity of the insulating layers 405 of the printed circuit board. The effective relative permittivity of the composite medium of the constitutive parameter adjustment via hole 403 is dependent on the volume occupied by the air vents 410, and is found from well-known theory and experiment results. It is possible to use the composite medium formed in such a constitutive parameter adjustment via hole to develop more miniaturized via transmission line, while maintaining the same value as that of the characteristic impedance of a via transmission line for the case of using no air vents. This conclusion may be derived by the use of the aforementioned (2) formula to (4) formula representing the characteristic impedance when the ground via holes are arranged on a circumference or in a square in the structure of the compact via transmission line. Furthermore, the formation of air vents allows effective relative permittivity of the composite medium to be reduced, thereby lowering an effective loss factor more than the insulating layers of the printed circuit board.

In this way, the composite medium formed of the air vents and the insulating materials of the printed circuit board makes it possible to comprise the compact via transmission line according to the invention of the present application, the cross-sectional area of which is reduced. In addition, higher-order modes in the compact via transmission line will be establish at higher frequencies due to reducing the effective permittivity and the distance to ground via holes forming the outer conductor boundary of the compact via transmission line. This allows the operating frequency range of the compact via transmission line to be enlarged. Moreover, the air vents of the compact via transmission line mounted on the printed circuit board improves air circulation in air-cooling, thereby enabling heat radiation characteristics in high-density mounting to be improved.

A fundamental wave of electromagnetic waves is mainly present between the central conductor and the ground via holes making up the outer conductor boundary in the compact via transmission line, so that the air vents may be formed not only in the area of the constitutive parameter adjustment via hole, but also in all area between the central conductor and the ground via holes.

Figure 5A:
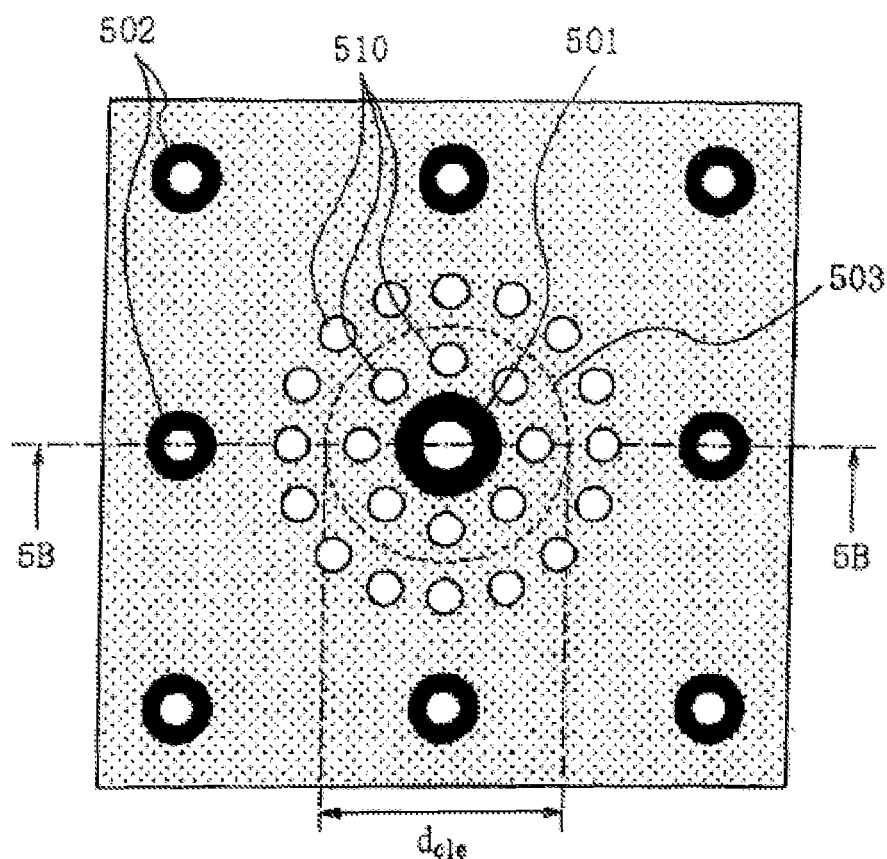
FIG. 5A is a plan view showing a compact via transmission line according to the invention of the present application having air vents formed between a central conductor and ground via holes, and provided with a constitutive parameter adjustment via hole and conductor plates forming ground layers of a printed circuit board in the printed circuit board.
Figure 5B:
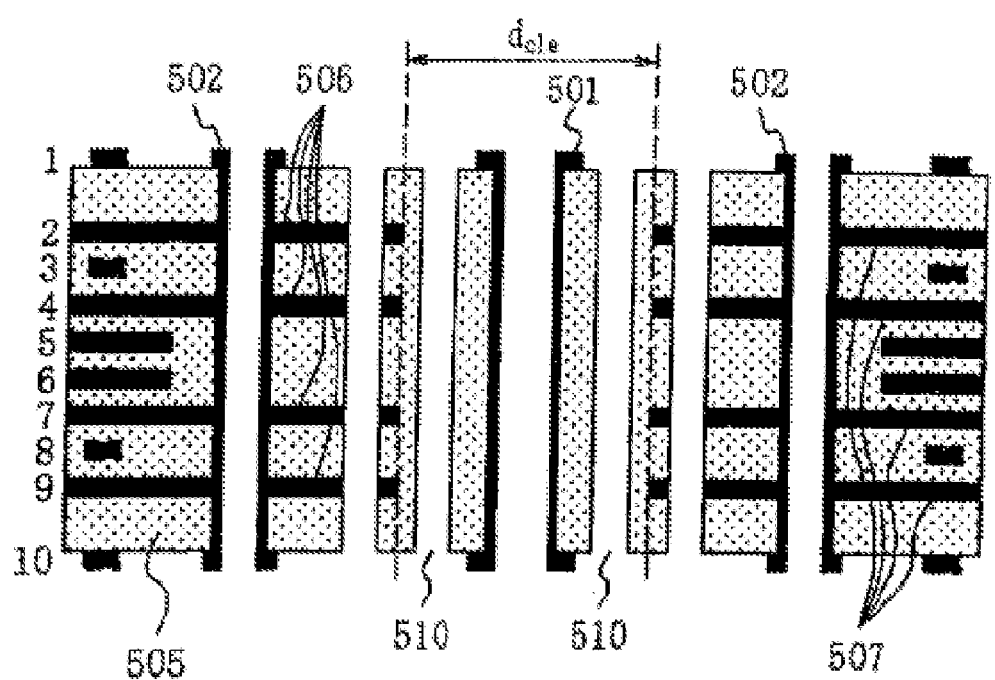
FIG. 5B is a longitudinal sectional view showing the compact via transmission line according to the invention of the present application having the air vents formed between the central conductor and the ground via holes, and provided with the constitutive parameter adjustment via hole and the conductor plates forming the ground layers of the printed circuit board in the printed circuit board.

FIG. 5A and FIG. 5B each have air vents formed between a central conductor 501 and ground via holes 502, and are a plan view and a cross-sectional view showing a compact via transmission line in a printed circuit board. Air vents 510 are formed in the area of the constitutive parameter adjustment via hole 503, and in the area between the constitutive parameter adjustment via hole 503 and the ground via holes 502 as to excavate conductive plates 506 from conductive layers 507.

The cross-section of the air vents in the compact via transmission line may be any shape and any size, but requires to be considerably smaller than the wavelength $\lambda$ of a propagation signal traveling through insulating layers 505 for insulating the conductor layers of the printed circuit board, for example, $1 < \lambda/8$. Here, 1 is the maximum dimension in the cross-section of the air vents, $\lambda$ being the minimum wavelength of the propagation signal in the insulating layer of the printed circuit board in a predetermined frequency range.

Figure 6A:
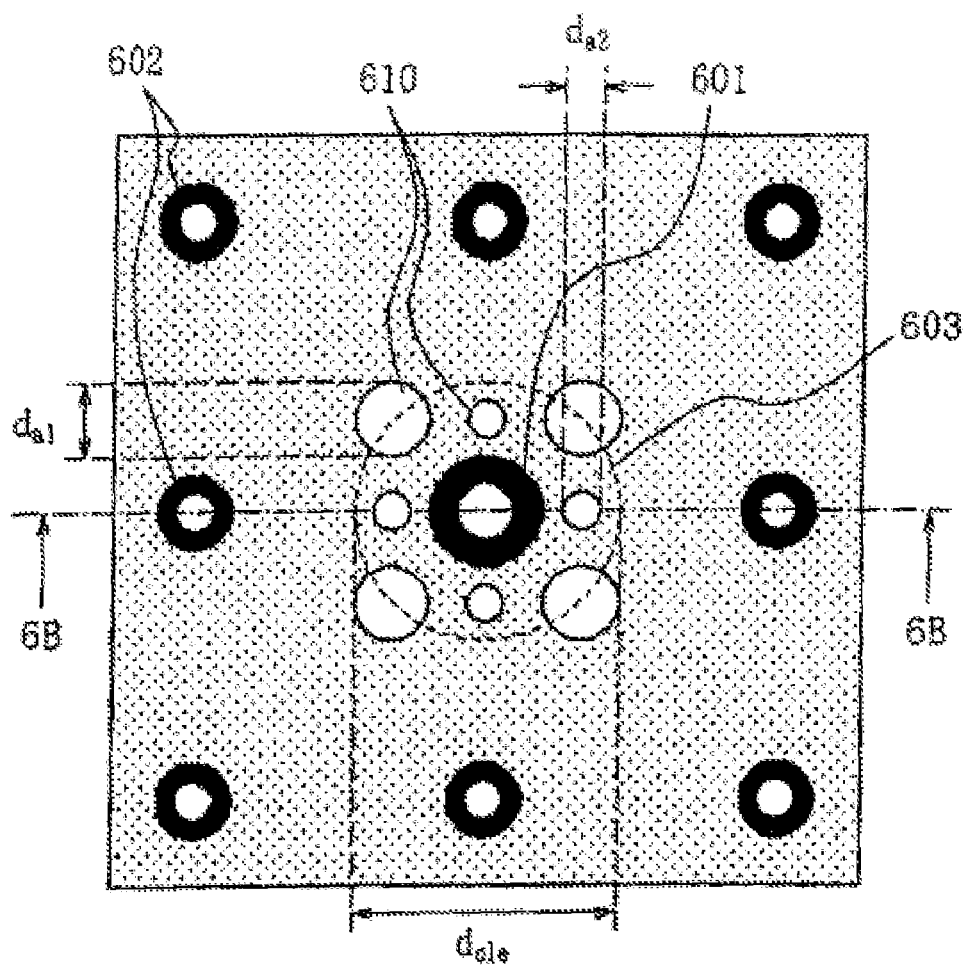
FIG. 6A is a plan view showing a compact via transmission line according to the invention of the present application in which round-shaped and different-sized air vents are formed in a printed circuit board.
Figure 6B:
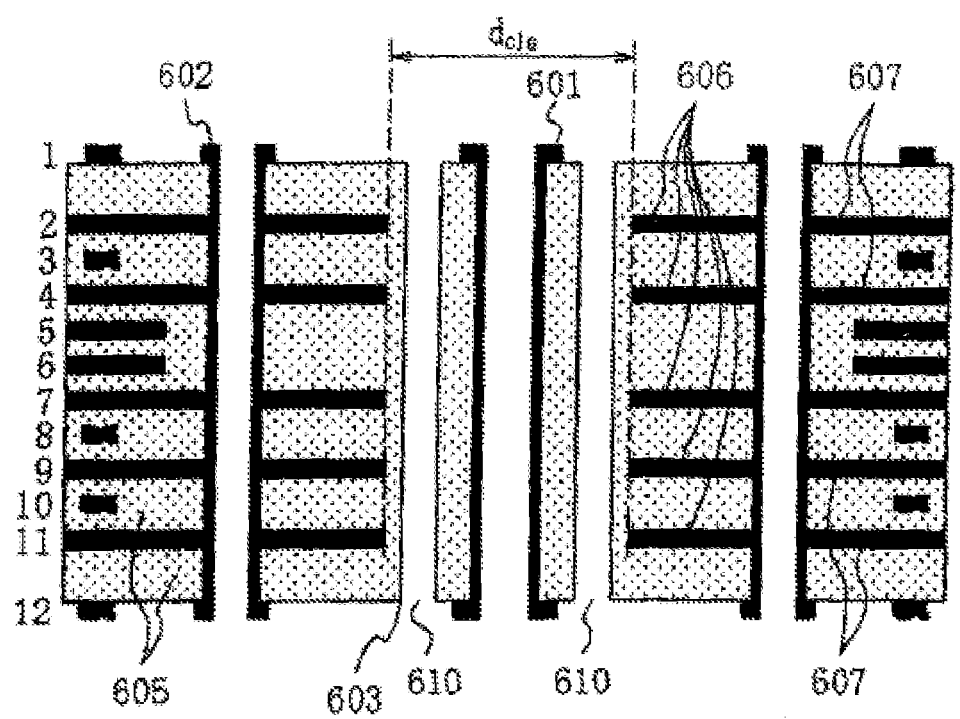
FIG. 6B is a longitudinal sectional view showing the compact via transmission line according to the invention of the present application in which the round-shaped and different-sized air vents are formed in the printed circuit board.

FIG. 6A and FIG. 6B are a plan view and a longitudinal sectional view showing the compact via transmission line according to the invention of the present application, in which round-shaped and different-sized air vents are formed in a printed circuit board. In FIG. 6, cylindrical-shaped air vents with a diameter of da1 and a diameter of da2 are each arranged between a central conductor 601 and ground via holes 602 forming a square outer conductor boundary.

Figure 7:
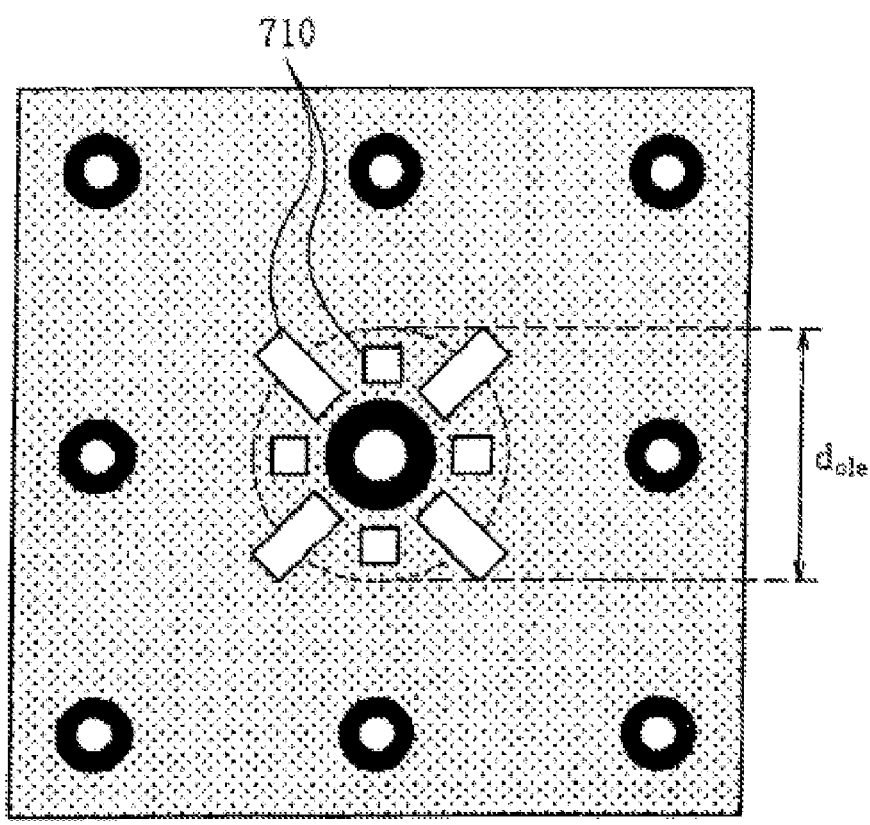
FIG. 7 is a plan view showing a compact via transmission line according to the invention of the present application in which square and rectangular air vents are formed.

FIG. 7 is a plan view showing the compact via transmission line according to the invention of the present application, in which square and rectangular air vents are formed. In FIG. 7, horizontal cross-sectional shapes of air vents 710 are square and rectangular, and have different size in rectangular shapes and square shapes as illustrated. FIG. 7 does not show a longitudinal cross-sectional view, but shows the same structure as the structure of the longitudinal sectional view shown in FIG. 5B. More specifically, the air vents 710 have the horizontal cross-sectional shapes with the square and rectangular cylindrical structure shown in FIG. 7.

Figure 8:
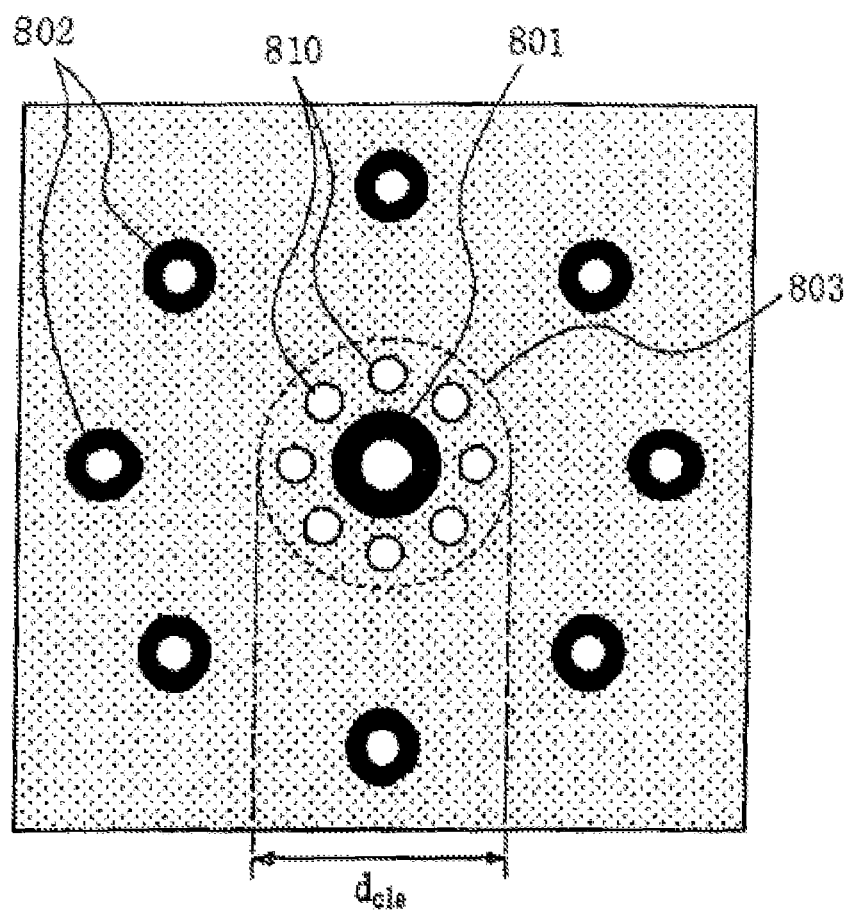
FIG. 8 is a plan view showing a compact via transmission line according to the invention of the present application in which air vents are arranged according to a predetermined criterion.

The air vents may be arranged in accordance with a predetermined rule, or may be irregularly arranged. FIG. 8 shows a concrete example of a compact via transmission line in which air vents 810 are arranged in accordance with the predetermined rule. Ground via holes 802 forming the outer conductor boundary of the compact via transmission line are arranged on a circumference around a central conductor 801 so that each distance from the central conductor 801 is equal. And, the air vents 810 are arranged around the central conductor 801 so that each distance of adjacent air vents is equal, and further each distance from the central conductor 801 is equal.

Figure 9:
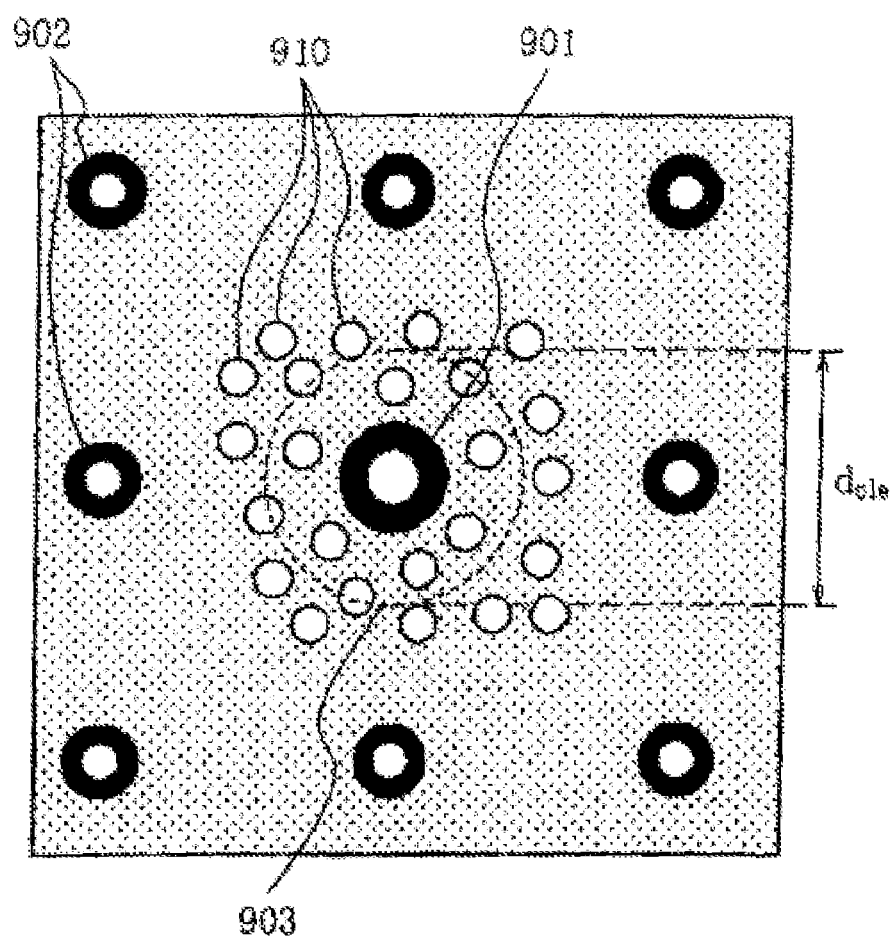
FIG. 9 is a plan view showing a compact via transmission line according to the invention of the present application in which air vents are irregularly arranged.

FIG. 9 is a plan view showing a compact via transmission line in which air vents 910 are irregularly arranged between a central conductor 901 and ground via holes 902 forming an outer conductor boundary.

A method of forming air vents in a compact via transmission line includes a wide variety of methods, such as a method of forming a hole in a mechanical fashion, and a method of forming a hole using a laser beam.

Figure 10A:
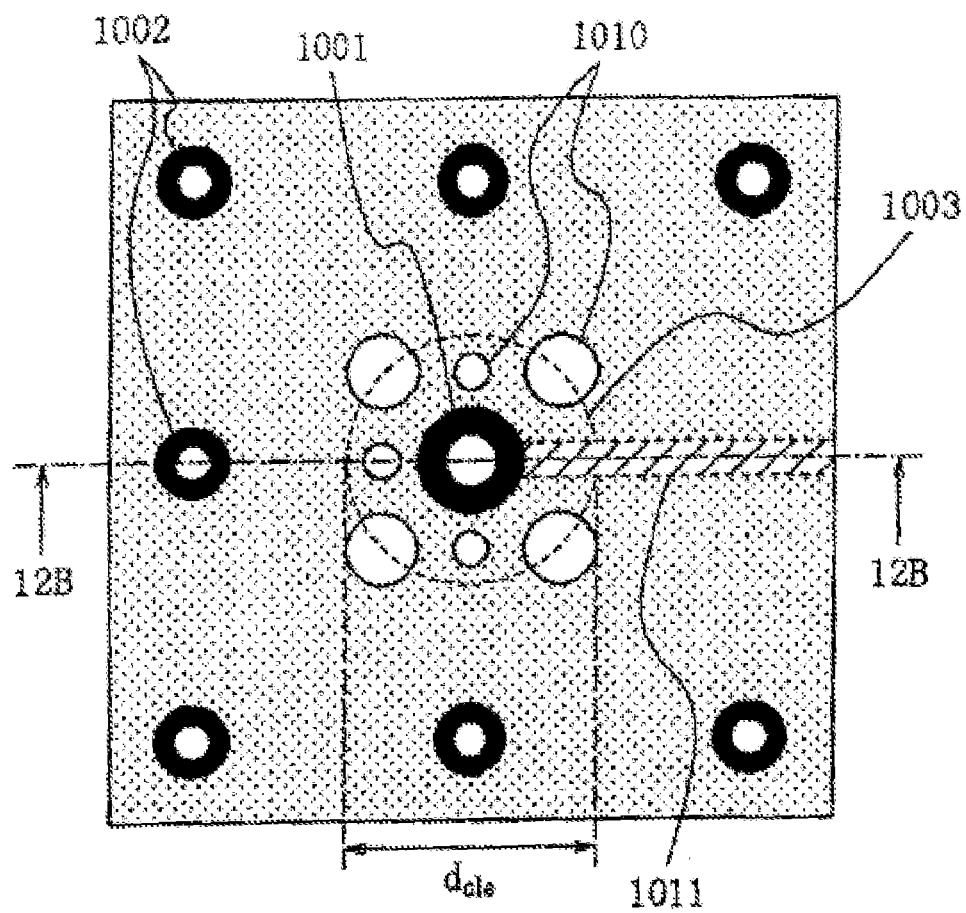
FIG. 10A is a plan view showing an interconnected circuit from a compact via transmission line to a strip line according to the invention of the present application in a printed circuit board.
Figure 10B:
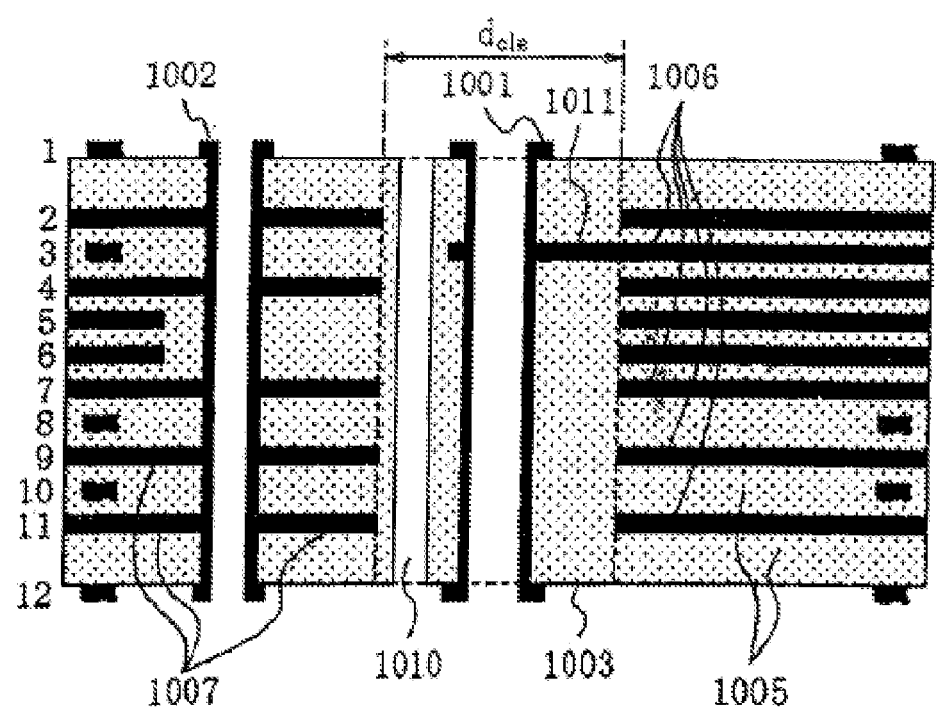
FIG. 10B is a longitudinal sectional view showing the interconnected circuit from the compact via transmission line to the strip line according to the invention of the present application in the printed circuit board.

It goes without saying that the compact via transmission line for the printed circuit board is used to connect different types of internal connection circuits of the printed circuit board. However, FIG. 10A and FIG. 10B show a concrete example in which a compact via transmission line is connected to a planar transmission line as a strip line 1011 in a multilayer printed circuit board with 12 layers. As can be seen from FIG. 10A and FIG. 10B, the compact via transmission line has a central conductor 1001, ground via holes 1002 arranged in a square, ground plates 1006 formed of conductor layers 1007 comprising the printed circuit board, and a constitutive parameter adjustment via hole 1003.

A composite medium in the compact via transmission line is formed of insulating layers 1005 for insulating conductor layers of the printed circuit board, and air vents 1010 formed differently in size between the central conductor 1001 and the ground via holes 1002 of the compact via transmission line in accordance with the predetermined rule. Here, four large air vents are arranged so that each distance of the adjacent air vents is equal, and is evenly arranged around the central conductor 1001, while three small air vents are evenly arranged around the central conductor 1001 between the adjacent large air vents. Furthermore, all the air vents are arranged to be symmetric with respect to the horizontal axis of the strip line 1011. Here, as can be seen from FIG. 10A, there is no corresponding small air vent in the area including the strip line 1011. The effective relative permittivity of the composite medium in the compact via transmission line is smaller than the relative permittivity of the insulating layers 1005, thus making it possible to miniaturize a transmission line connected to the strip line 1011, while maintaining the characteristic impedance of the strip line 1011 at the same value.

Figure 11A:
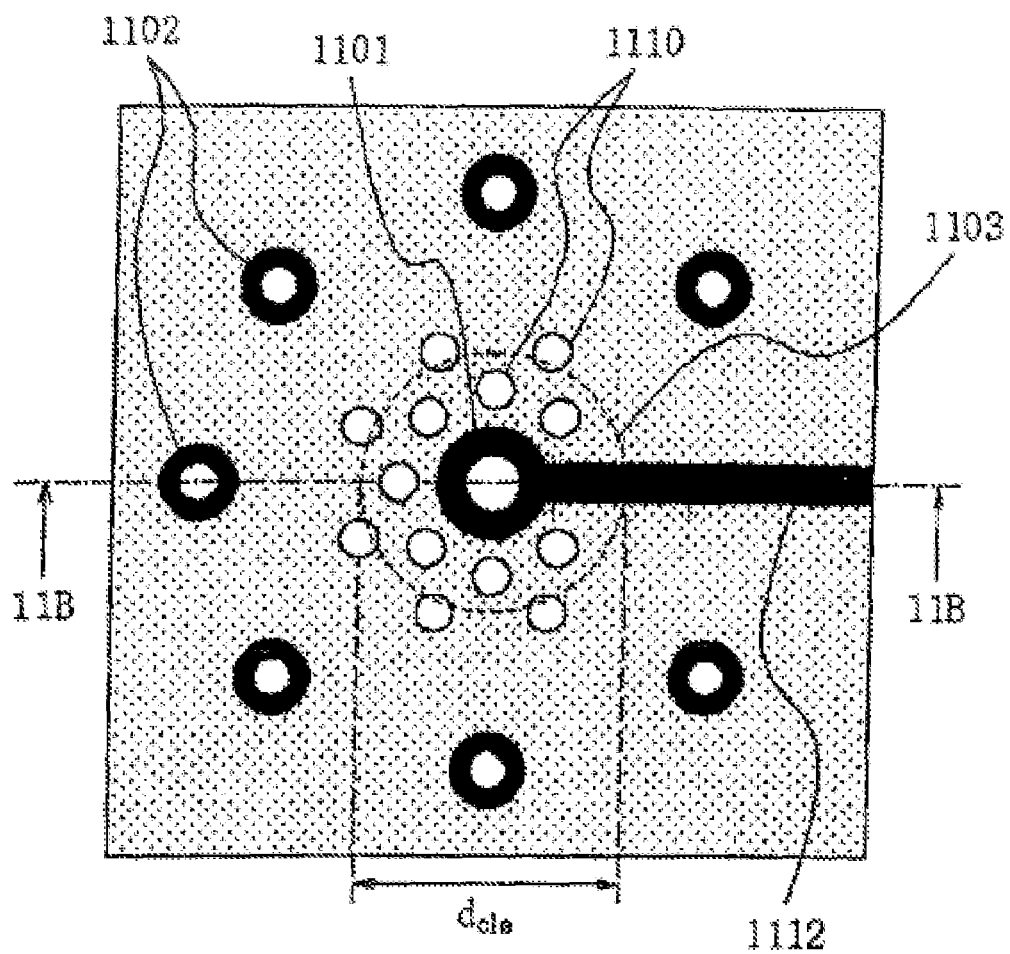
FIG. 11A is a plan view showing an interconnected circuit from a compact via transmission line to a micro-strip line according to the invention of the present application in a printed circuit board.
Figure 11B:
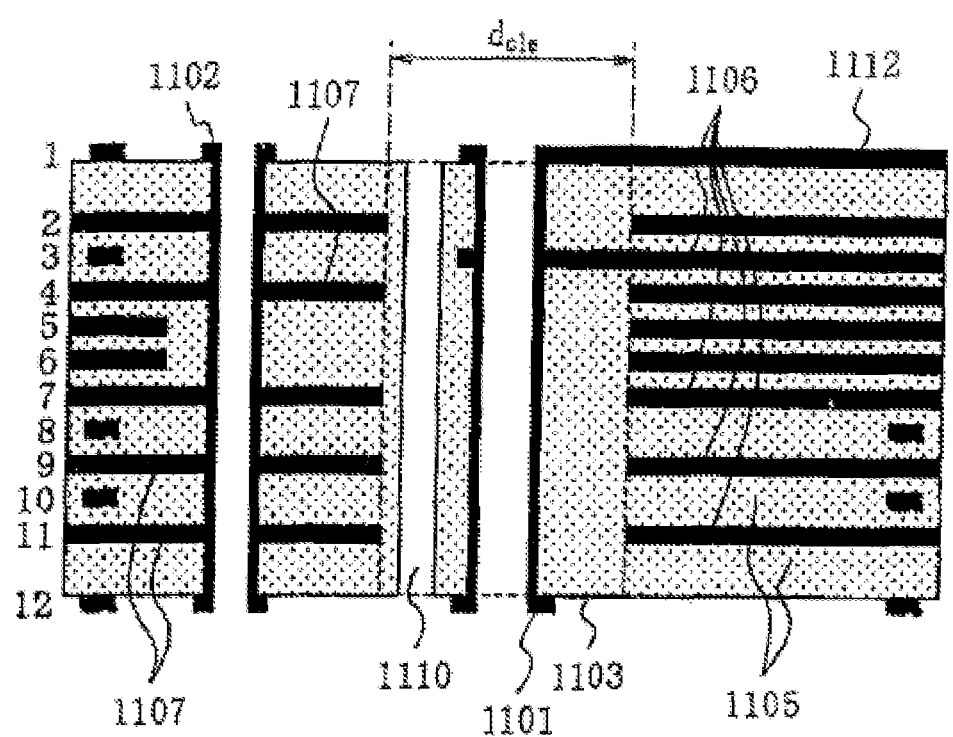
FIG. 11B is a longitudinal sectional view showing the interconnected circuit from the compact via transmission line to the micro-strip line according to the invention of the present application in the printed circuit board.

FIG. 11A and FIG. 11B show a concrete example in which a compact via transmission line is connected to a planar transmission line as a micro-strip line 1112 in a multilayer printed circuit board with 12 layers. As can be seen from FIG. 11A and FIG. 11B, the compact via transmission line has a central conductor 1101, ground via holes 1102 arranged on a circumference, ground plates 1106 formed of conductor layers 1107 comprising a printed circuit board, and a constitutive parameter adjustment via hole 1103.

A composite medium in the compact via transmission line is formed of insulating layers 1105 for insulating conductor layers of the printed circuit board, and air vents 1110 arranged irregularly between the central conductor 1101 and the ground via holes 1102 of the compact via transmission line except for the area of the micro-strip line 1112. The effective relative permittivity of the composite medium in the compact via transmission line is smaller than the relative permittivity of the insulating layers 1105, thus making it possible to miniaturize a transition to the micro-strip line 1112, while maintaining the characteristic impedance of the micro-strip line 1112 at the same value.

Figure 12:
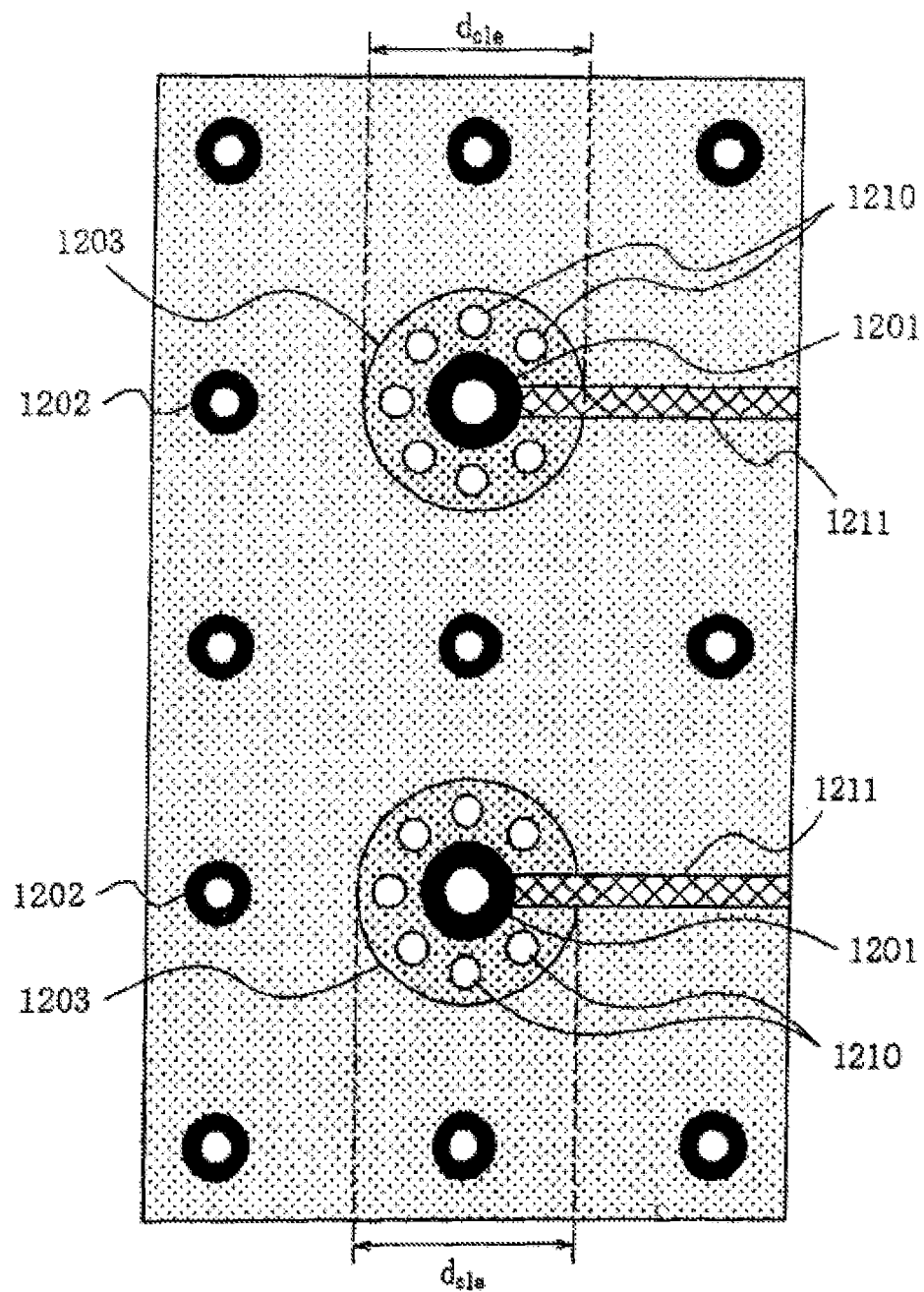
FIG. 12 is a plan view showing two primitive cells forming a compact via transmission line according to the invention of the present application, as well as having a composite via hole structure for connecting each cell to two strip lines in order to transmit a differential signal.

FIG. 12 shows an example of a compact via transmission line for transmitting a differential signal, in which two primitive cells for a high-density via hole structure are shown. These two primitive cells make up a signal via hole pair, and are each connected to a strip line pair as an example of a planar transmission line. The compact via transmission line comprises two signal via holes 1201 each surrounded by ground via holes 1202, ground layers formed of conductor layers, and two constitutive parameter adjustment via holes 1203. Air vents 1210 are formed for the purpose of obtaining the characteristic impedance matching of the compact via transmission line to the strip line pair.

Figure 13:
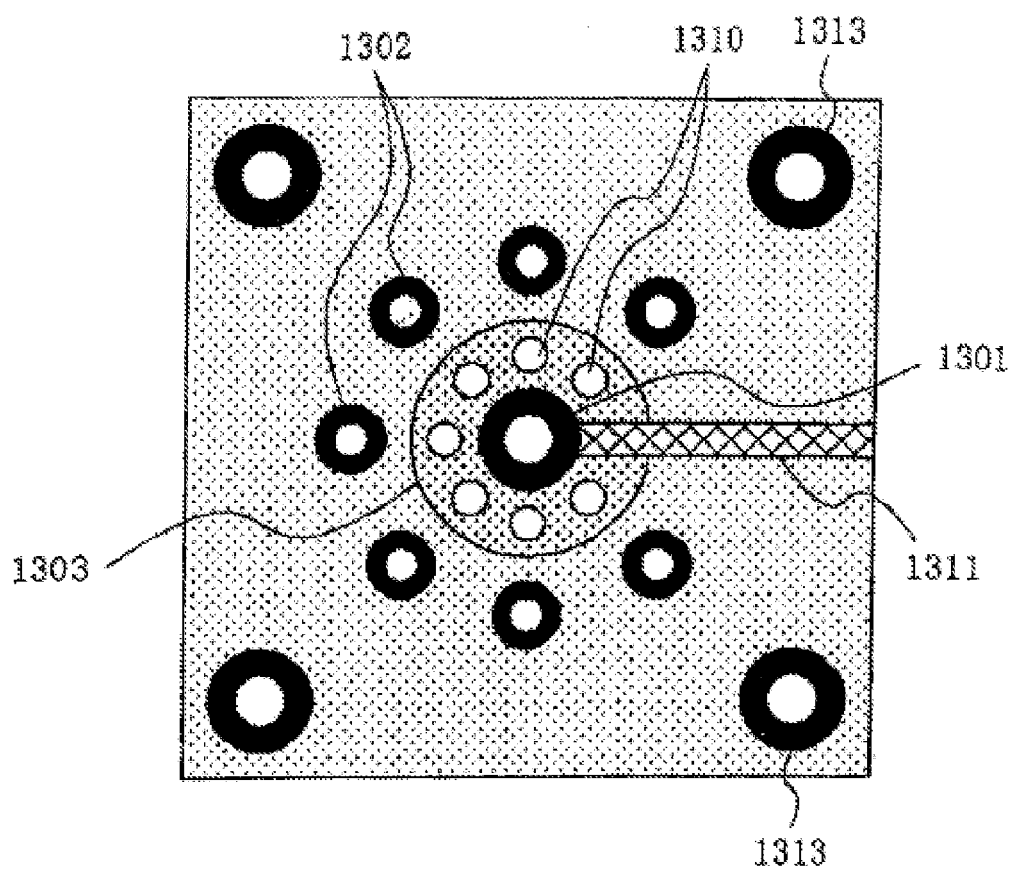
FIG. 13 is a plan view showing a via hole structure under an SMA connector in which a compact via transmission line according to the invention of the present application is formed and connected to a strip line in a printed circuit board.

FIG. 13 is a plan view showing a via hole structure under an SMA (sub-miniature-type-A) connector which is an applied example of a compact via transmission line. A usual SMA connector pin is provided with a central conductor 1301 and ground via holes 1313. Connection of a strip line 1311 as an example of a planar transmission line structure to the central conductor 1301 is shown a gain in said FIG. 3.

However, a usual via transmission line produces a large radiation and leakage losses at high frequencies, and is subject to restrictions of an operating frequency range caused by higher-order modes dependent on the distance to the ground via holes 1313.

In order to achieve an excellent via hole structure under the SMA connector, the use of the compact via transmission line according to the invention of the present application is effective. The compact via transmission line has a central conductor 1301, ground via holes 1302 arranged on a circumference, ground plates from conductor layers of a printed circuit board, and a constitutive parameter adjustment via hole 1303. In addition, a composite medium is formed by excavating air vents 1310 in insulating layers.

The distance between the central conductor 1301 and the ground via holes 1302, and the number and the size of the air vents 1310 are defined so that the characteristic impedance is optimized in an interconnected circuit including the SMA connector and the strip line. And, its structure is such that only the electromagnetic wave of a fundamental mode mainly propagates in a predetermined frequency range. More specifically, the electric field and the magnetic field of a principal electromagnetic wave propagating on the printed circuit board is in a direction perpendicular to a propagation direction, and are set so that the electric field and the magnetic field are at right angles to each other for propagation, provided that an electromagnetic wave propagating on an actual printed circuit board includes not only the electromagnetic wave of the fundamental mode described above, but also such an electromagnetic wave that the electric field and the electromagnetic field are deviated from a direction perpendicular to a propagation direction, and are not at right angles to each other. The invention of the present application is similarly applicable to this case.

In the aforementioned embodiments, the central conductor, the ground via holes, the constitutive parameter adjustment via hole, and the filling media are provided so as to penetrate from a surface to a rear surface of the multilayer printed circuit board, but are not necessarily required to penetrate therethrough. It is possible to form part or all of the central conductor, the ground via holes, the constitutive parameter adjustment via hole, and the filling medium ranging from the surface of the multilayer printed circuit board to an internal board comprising the multilayer printed circuit board.

Figure 14A:
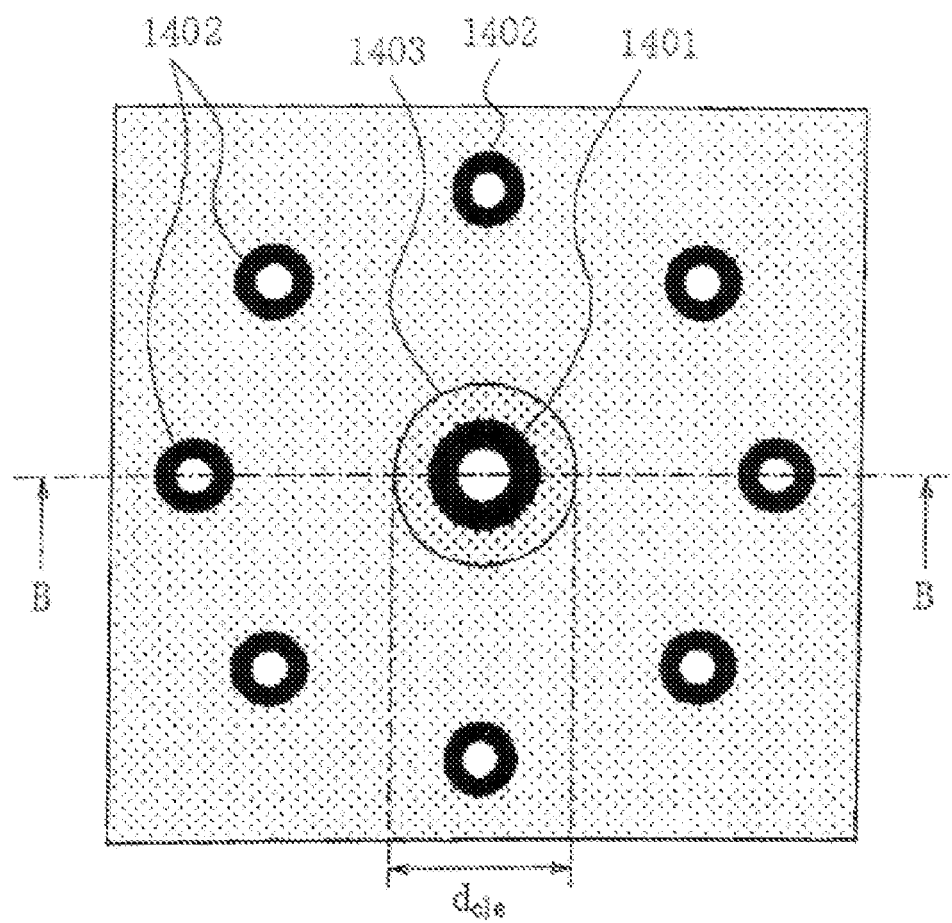
FIG. 14A is a plan view showing a compact via transmission line according to the invention of the present application in which ground via holes are arranged on a circumference, and in which a central conductor, ground via holes, a constitutive parameter adjustment via hole, and a filling medium are formed part of the way from a surface of a multilayer printed circuit board in a printed circuit board.
Figure 14B:
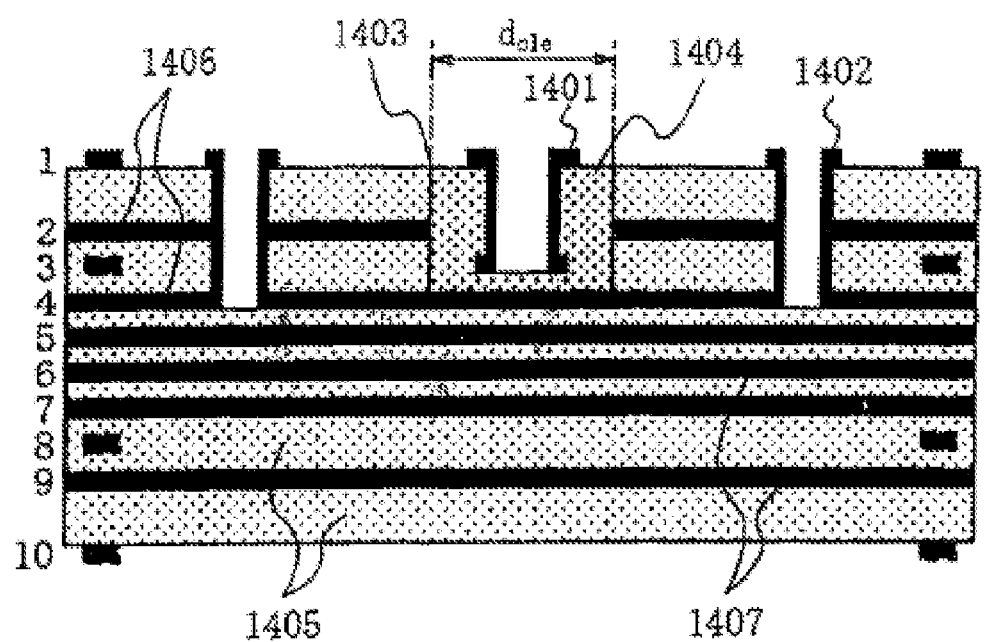
FIG. 14B is a longitudinal sectional view showing the compact via transmission line according to the invention of the present application in which the ground via holes are arranged on a circumference, and in which the central conductor, the ground via holes, the constitutive parameter adjustment via hole and the filling medium are formed part of the way from a surface of a multilayer printed circuit board in a printed circuit board.

FIG. 14A and FIG. 14B are a plan view and a cross-sectional view showing the compact via transmission line according to the invention of the present application, in which ground via holes 1402 are each arranged on a circumference, and a central conductor 1401, the ground via holes 1402, a constitutive parameter adjustment via hole 1403, and a filling medium 1404 are formed part of the way from a surface of a multilayer printed circuit board in a printed circuit board. In the structure shown in FIG. 2A and FIG. 2B described above, the central conductor 201, the ground via holes 202, the constitutive parameter adjustment via hole 203, and the filling medium 204 are provided so as to penetrate from the surface to the rear surface of the multilayer printed circuit board. On the other hand, in the structure shown in FIG. 14A and FIG. 14B according to the present embodiment, the central conductor 1401 is formed from a first layer which is a top surface layer to a third layer, and the ground via holes 1402, the constitutive parameter adjustment via hole 1403, and the filling medium 1404 are formed from the first layer which is the top surface layer to a fourth layer.

Figure 15A:
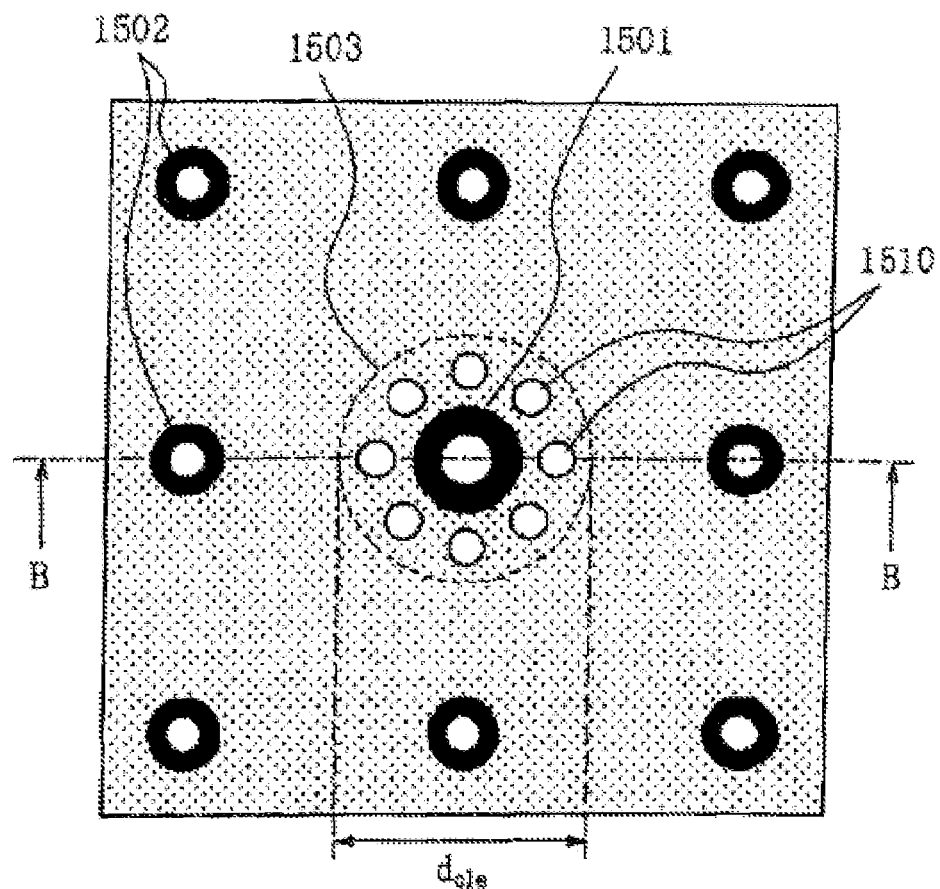
FIG. 15A is a plan view showing a compact via transmission line according to the invention of the present application in which air vents are formed in the area of a constitutive parameter adjustment via hole of the compact via transmission line, and in which a central conductor, ground via holes, the constitutive parameter adjustment via hole, and a filling medium are formed part of the way from a surface of a multilayer printed circuit board in a printed circuit board.
Figure 15B:
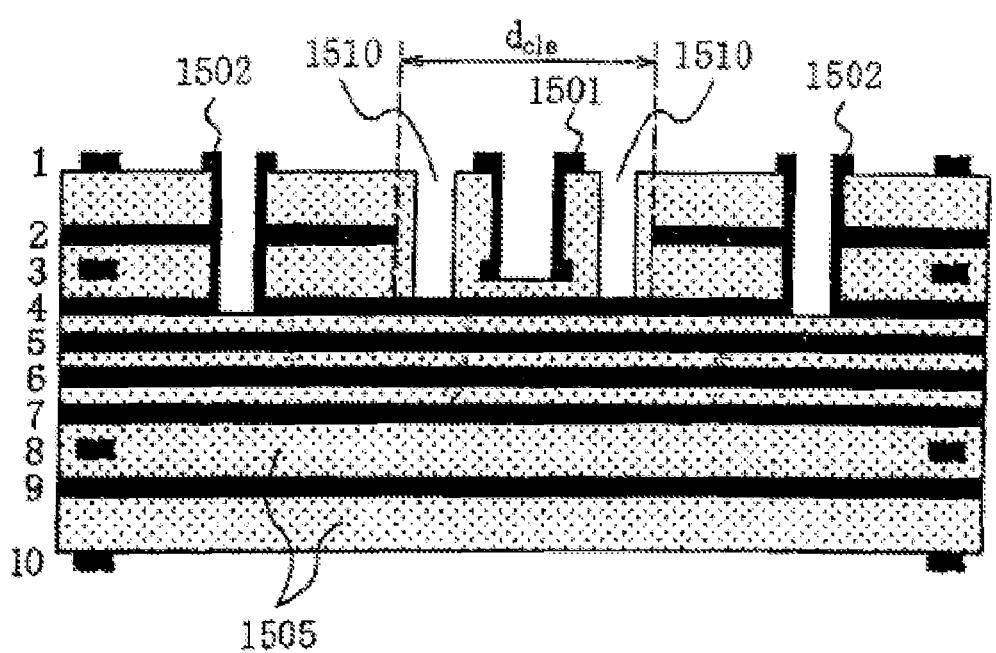
FIG. 15B is a longitudinal sectional view showing the compact via transmission line according to the invention of the present application in which the air vents are formed in the area of the constitutive parameter adjustment via hole of the compact via transmission line, and in which the central conductor, the ground via holes, the constitutive parameter adjustment via hole, and the filling medium are formed part of the way from a surface of a multilayer printed circuit board in a printed circuit board.

FIG. 15A and FIG. 15B are a plan view and a cross-sectional view showing the compact via transmission line according to the invention of the present application, in which air vents are formed in the area of a constitutive parameter adjustment via hole of a compact via transmission line, and a central conductor 1501, ground via holes 1502, a constitutive parameter adjustment via hole 1503, and air vents 1510 are formed part of the way from a surface of a multilayer printed circuit board, respectively. The structure of the present embodiment shown in FIG. 15A and FIG. 15B is similar to the structure shown in FIG. 4A and FIG. 4B except for the following points. According to the present embodiment shown in FIG. 15A and FIG. 15B, the central conductor 1501 is formed from a first layer which is a top surface layer to a third layer, and the ground via holes 1502, the constitutive parameter adjustment via hole 1503, and the air vents 1510 are formed from the first layer which is the top layer to a fourth layer.

In this way, the characteristic impedance of the compact via transmission line may be optimized by forming part or all of the central conductor, the ground via holes, the constitutive parameter adjustment via hole, and the filling medium ranging from a surface of the multilayer printed circuit board to an internal board comprising the multilayer printed circuit board.

Next, in order to demonstrate the superiority of the compact via transmission line, some simulation results on high-speed signal propagation in a structure including the compact via transmission line will be described. The simulation results show the superiority of the compact via transmission line in terms of the magnitudes of S parameters calculated by the finite-difference time-domain (FDTD) method. The FDTD method can be said to be the most accurate, appropriate, and multi-purpose theoretical calculation technique to describe the features of the interconnected circuits.

Figure 16A:
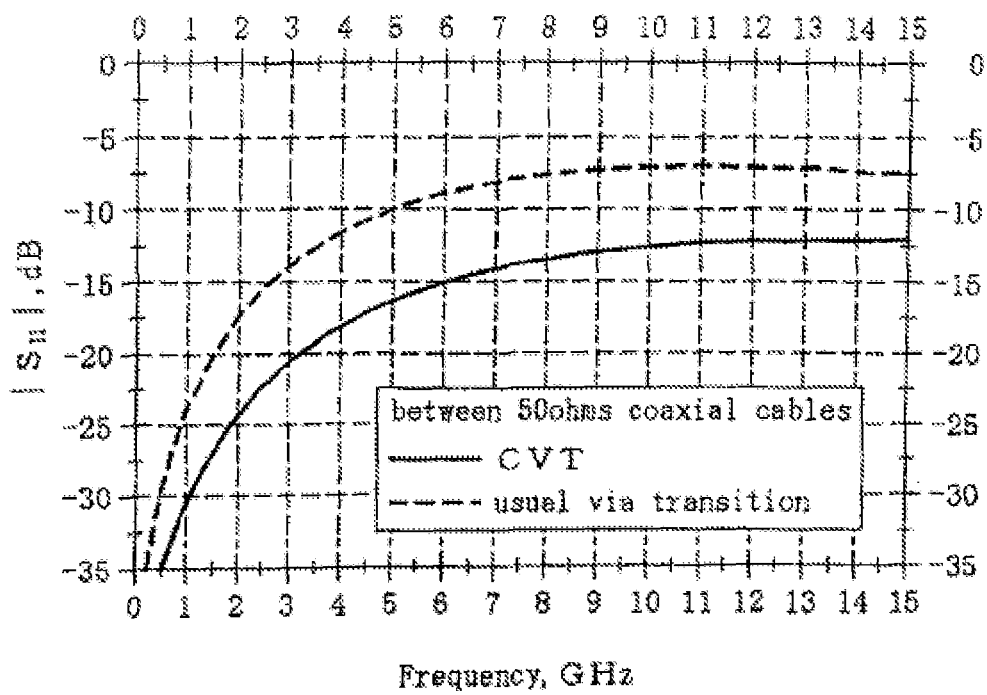
FIG. 16A is a diagram showing simulation results of a reflection coefficient with respect to a usual via transmission line mounted on a multilayer board formed with 12 conductor layers and a compact via transmission line according to the present invention.
Figure 16B:
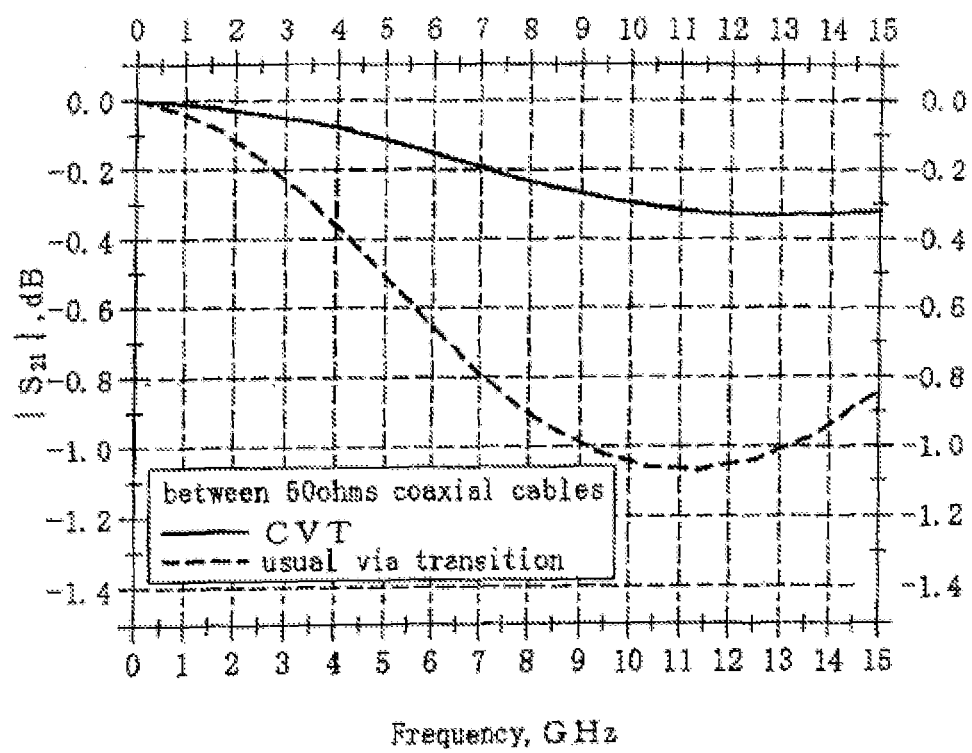
FIG. 16B is a diagram showing simulation results of a transmission coefficient with respect to the usual via transmission line mounted on the multilayer board formed with 12 conductor layers and the compact via transmission line according to the present invention.

FIG. 16A is a diagram showing simulation results of frequency dependency of a reflection coefficient (S11 parameter) with respect to a usual via transmission line mounted on a multilayer board formed of 12 conductor layers and the compact via transmission line according to the invention of the present application in the case of transmission from a 50 ohm coaxial cable to other 50 ohm coaxial cables through the compact via transmission line. FIG. 16B is a diagram showing simulation results of frequency dependency of a transmission coefficient (S21-parameter) with respect to the usual via transmission line mounted on the multilayer board formed of the 12 conductor layers and the compact via transmission line according to the invention of the present application in the case of transmission from the 50 ohm coaxial cable to other 50 ohm coaxial cable through the compact via transmission line. The compact via transmission line is mounted on the multilayer printed circuit board with 12 conductor layers, and is formed of a central conductor, eight ground via holes arranged in a square, ground plates of conductor layers, eight air vents, and a constitutive parameter adjustment via hole.

The geometric shapes of the compact via transmission line and the multilayer board with 12 layers used for the simulation are identical to those shown in FIG. 6A and FIG. 6B. Here, the size of the central conductor and the eight ground via holes used for the simulation is as follows. Namely, the diameter of the central conductor, $d_{rod}$ is 0.65 mm, the dimension of a square, $R_{sq}=D_{sq}/2$, where the ground via holes are arranged is 1.66 mm, the pad diameter of a signal via hole is 0.95 mm, the diameter of the constitutive parameter adjustment via hole of the compact via transmission line, $d_{cle}$ is 1.65 mm, the diameter of large air vents, $d_{a1}$ is 0.5 mm, and the diameter of small air vents, $d_{a2}$ is 0.3 mm.

The magnitude of S parameters with respect to the interconnection structure including this compact via transmission line is shown up to 15 GHz in solid line. In addition, for comparison purposes, S parameters of the coaxial cables having the same parameters connected to the via transmission line without air vents mounted on the same printed circuit board are shown in dashed line. The smaller the reflection coefficient |S11| in FIG. 16A gives the better the transmission characteristics. For example, in 10 GHz, the difference of the |S11| between the usual via transmission line and the compact via transmission line is 6 dB or so, but this indicates that the reflection amount of a signal in the compact via transmission line becomes half of the reflection amount of a signal in the usual via transmission line based on a linear scale.

And, FIG. 16B shows a transmission coefficient |S21|, which indicates a signal loss, and it can be said that the closer to zero, the better the transmission characteristics. In 10 GHz, a signal loss in the compact via transmission line is −0.3 dB, and 3% or so in the linear scale, while a signal loss in the usual via transmission line is not less than −1.0 dB, and not less than 10% in the linear scale. In this way, it is obvious that the compact via transmission line is superior over the usual via transmission line from the comparison of S parameters obtained by the simulation in terms of the signal reflection amount and the signal loss.

Consideration is given to the adjustment of the distance between the central conductor and the ground via holes so that characteristic impedance of 50 ohm is matched in order to reduce the reflection amount in the usual via transmission line, while maintaining relative permittivity of 4.2 and the diameter of the central via hole conductor, $d_{rod}$=0.65 mm are constant. In accordance with the aforementioned (3) formula, if the distance between the central conductor and the ground via holes is increased up to one and half times the dimensions of the compact via transmission line shown in FIG. 6A and FIG. 6B, the impedance matching may be achieved. However, the larger the structure, an unnecessary propagation mode of a higher order usually occurs at lower frequencies, and operating frequencies that can be used will be lowered. As has been described hereinbefore, it can be understood from these simulation results that the use of the air vents is very effective in miniaturizing the via transmission line.

Figure 17A:
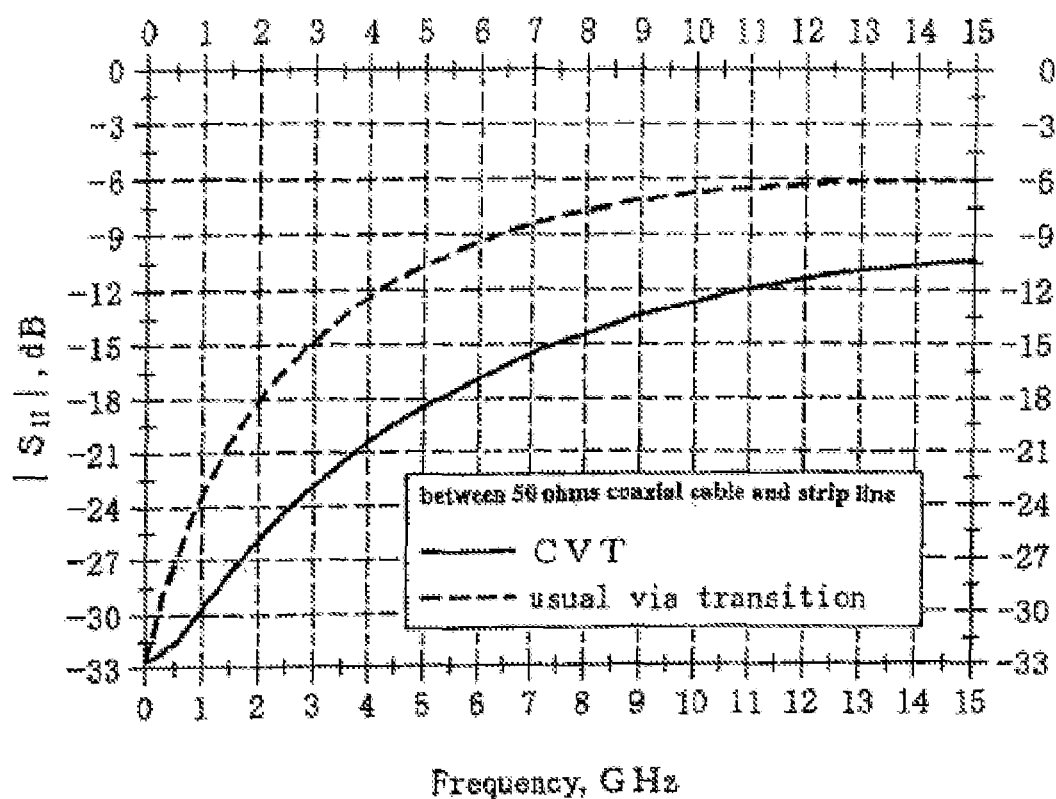
FIG. 17A is a diagram showing simulation results of a reflection coefficient with respect to a usual via transmission line mounted on a multilayer board formed with 12 conductor layers and a compact via transmission line according to the present invention.
Figure 17B:
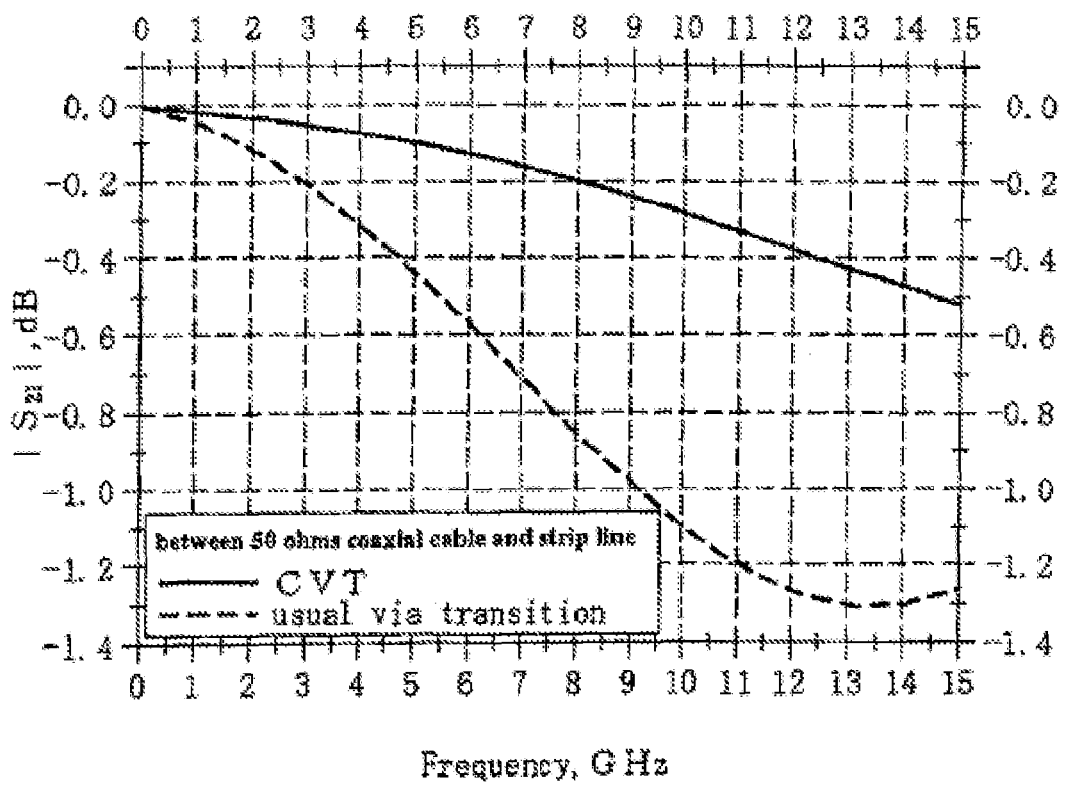
FIG. 17B is a diagram showing simulation results of a transmission coefficient with respect to the usual via transmission line mounted on the multilayer board formed with 12 conductor layers and the compact via transmission line according to the present invention.

FIG. 17A is a diagram showing simulation results of frequency dependency of a reflection coefficient (S11 parameter) with respect to a usual via transmission line mounted on a multilayer board formed of 12 conductor layers and the compact via transmission line according to the invention of the present application in the case of transmitting a signal between a 50 ohm coaxial cable and a 50 ohm strip line through the compact via transmission line. FIG. 17B is a diagram showing simulation results of frequency dependency of a transmission coefficient (S21-parameter) with respect to the usual via transmission line mounted on the multilayer board formed of 12 conductor layers and the compact via transmission line according to the invention of the present application in the case of transmitting a signal between the 50 ohm coaxial cable and the 50 ohm strip line through the compact via transmission line.

The compact via transmission line and the strip line are mounted on the multilayer board with 12 layers as shown in FIG. 10A and FIG. 10B. Here, all the dimensions of the air vents comprising the printed circuit board, the signal via hole, the ground via holes, the constitutive parameter adjustment via hole, and the compact via transmission line are identical to the dimensions used in the aforementioned simulation results. And, the arrangement of the ground via holes and the air vents is as in the case described above, but as can be seen from FIG. 10A and FIG. 10B, one smaller air vent is excluded from the area in which the strip line 1011 disposed at a third conductor layer is arranged.

The coaxial cable is connected to the signal via hole of the compact via transmission line at 12th conductor layer arranged at the bottom of the printed circuit board. The magnitude of S parameters with respect to an interconnection structure including the compact via transmission line, the coaxial cables, and the strip line is shown up to 15 GHz in solid line.

In addition, for comparison purposes, S parameters with respect to a via transmission line having the same interconnection structure and being different only in providing no air vents are shown in dashed line. Just as described above with reference to FIG. 16A and FIG. 16B, it is to be understood that electric characteristics may be improved, and yet the via transmission line may be miniaturized by providing the air vents between the signal via hole and the ground via holes from these FIG. 17A and FIG. 17B.

Figure 18A:
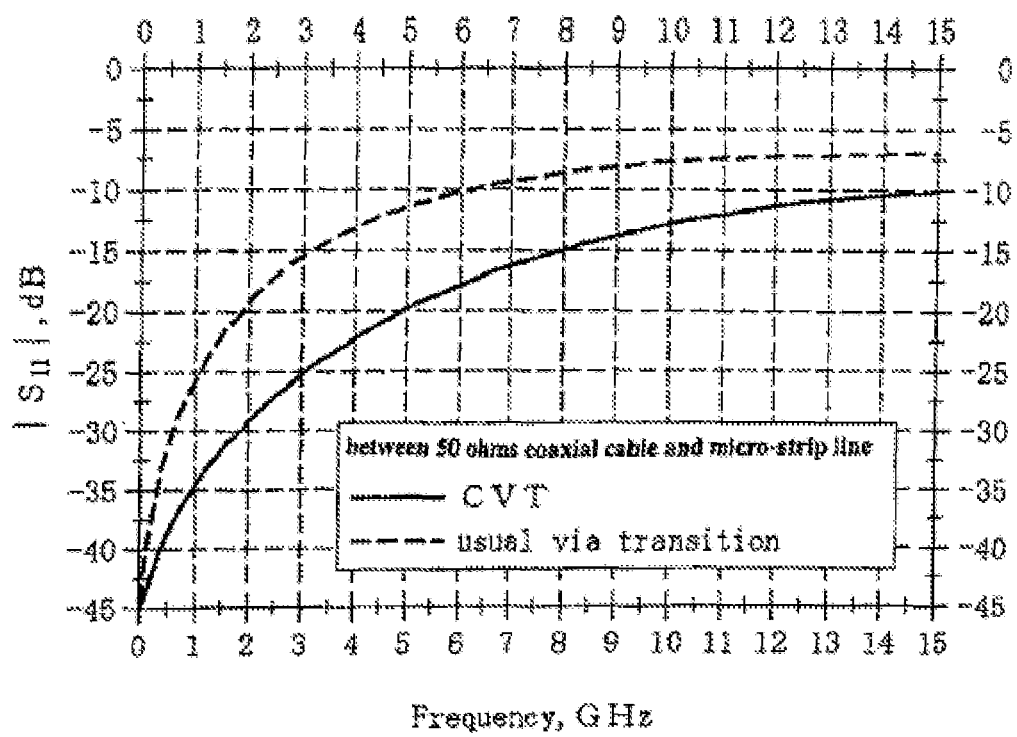
FIG. 18A is a diagram showing simulation results of a reflection coefficient with respect to a usual via transmission line mounted on a multilayer board formed with 12 conductor layers and a compact via transmission line according to the present invention.
Figure 18B:
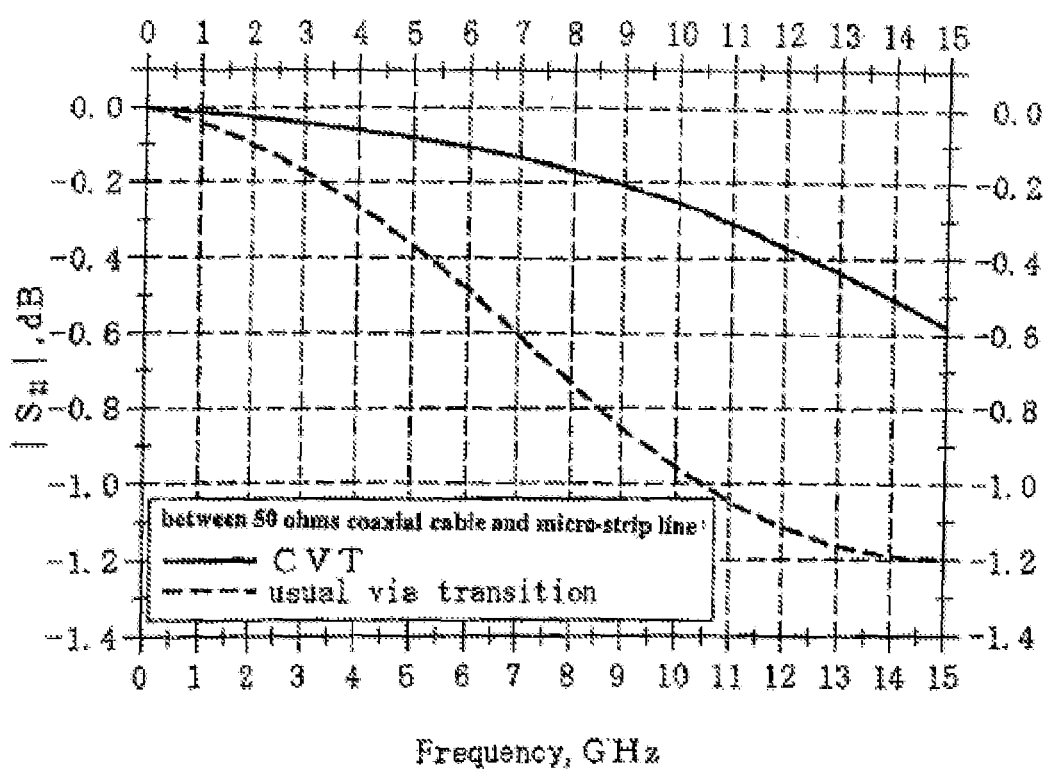
FIG. 18B is a diagram showing simulation results of a transmission coefficient with respect to the usual via transmission line mounted on the multilayer board formed with 12 conductor layers and the compact via transmission line according to the present invention.

FIG. 18A is a diagram showing simulation results of frequency dependency of a reflection coefficient (S11 parameter) with respect to a usual via transmission line mounted on a multilayer board formed of 12 conductor layers and the compact via transmission line according to the invention of the present application in the case of transmitting a signal between a 50 ohm coaxial cable and a 50 ohm micro-strip line through the compact via transmission line. FIG. 18B is a diagram showing simulation results of frequency dependency of a transmission coefficient (S21-parameter) with respect to the usual via transmission line mounted on the multilayer board formed of the 12 conductor layers and the compact via transmission line according to the present invention in the case of transmitting a signal between the 50 ohm coaxial cable and the 50 ohm micro-strip line through the compact via transmission line.

All parameters and arrangements of the interconnection structure shown in FIG. 18A and FIG. 18B are identical to those discussed in FIG. 17A and FIG. 17B, but are different only in that the strip lines in FIG. 17A and FIG. 17B are replaced by the 50 ohm micro-strip lines formed in a first conductor layer of the board. The magnitude of S parameters with respect to the interconnection structure including the compact via transmission line, the coaxial cables, and the micro-strip line is shown up to 15 GHz in solid line.

In addition, for comparison purposes, S parameters with respect to the via transmission line having the same interconnection structure and being different only in providing no air vents are shown in dashed line. And, the conclusion obtained from the simulation results for the aforementioned two interconnection structures is identical to that on the structures shown in FIG. 18A and FIG. 18B. More specifically, just as described above with reference to FIG. 16A, FIG. 16B, FIG. 17A, and FIG. 17B, it is to be understood that the electric characteristics may be improved, and yet the via transmission line may be miniaturized by providing the air vents between the signal via hole and the ground via holes from these FIG. 18A and FIG. 18B.

As has been described hereinbefore, it is very effective in miniaturizing the printed circuit board, and stabilizing and extending the operating frequency range of signal wiring formed on the printed circuit board to use the compact via transmission line for the printed circuit board according to the present invention in all kinds of interconnection structures, such as coaxial cables, bonding wires, each pin for LSI, and planar transmission lines. In addition, it is possible to reduce a signal loss when a signal passes through the via hole.

As a particular example, the formation of a plurality of air vents between the central conductor and the outer conductor layer boundary of the compact via transmission line provides the same effects as in the case of filling the constitutive parameter adjustment via hole with a medium material having the required relative permittivity.

The air vents serve to make any arrangement in any shape in order to achieve the demand characteristics of a substance satisfying the compact via transmission line, despite of the restriction that a maximum length of l in the cross-sectional shapes of the air vents is made significantly smaller (typically, $l < \lambda/8$) than a wavelength of λ defined as the minimum wavelength of a propagation signal in the insulating layers of the printed circuit board in the predetermined frequency range.

As supplemental effects, the air vents serve not only to reduce the signal loss of the via transmission line, but also to improve air flow for air-cooling, thereby making it possible to improve heat radiation characteristics in the high-density mounting. In addition, the compact via transmission line according to the invention of the present application is very effective for development and design of a complicated and high-density via hole structure mounted on the printed circuit board and a via hole structure for transmitting the differential signal.

INDUSTRIAL APPLICABILITY

It is to be understood that the present invention is applicable to anything that relates to a compact via transmission line for a printed circuit board, and a design method of the same, and is not intended to be limited in its applicability.

While the present invention has been described in relation to some preferred embodiments and exemplary embodiments, it is to be understood that these embodiments and exemplary embodiments are for the purpose of description by example, and not of limitation. While it will be obvious to those skilled in the art upon reading the present specification that various changes and substitutions may be easily made by equal components and art, it is obvious that such changes and substitutions lie within the true scope and spirit of the appended claims.

The invention claimed is:

1. A compact via transmission line for a printed circuit board provided on the printed circuit board,
    wherein said compact via transmission line comprises a central conductor which forms an inner conductor boundary of said compact via transmission line, and through which a signal transmits;
    a plurality of ground via holes which form an outer conductor boundary of said compact via transmission line;
    a ground plate formed of a conductor layer of said printed circuit board connected to said ground via holes;
    a constitutive parameter adjustment via hole provided between said inner conductor boundary and said outer conductor boundary to adjust a constitutive parameter of said printed circuit board; and
    air vents provided between said inner conductor boundary and said outer conductor boundary to excavate said printed circuit board.

2. The compact via transmission line for the printed circuit board according to claim 1,
    wherein said air vents are provided on said printed circuit board to adjust characteristic impedance of a via transmission line provided on said printed circuit board and an interconnected circuit connected to the via transmission line.

3. The compact via transmission line for the printed circuit board according to claim 1,
    wherein said air vents comprise said air vents formed of at least two different sized round shapes.

4. The compact via transmission line for the printed circuit board according to claim 1,
    wherein said air vents are irregularly arranged between said inner conductor boundary and said outer conductor boundary.

5. The compact via transmission line for the printed circuit board according to claim 1,
    wherein said air vents are arranged to be symmetric with respect to said signal via hole.

6. The compact via transmission line for the printed circuit board according to claim 1,
    wherein the maximum dimension of cross-sectional shapes of said air vents is not more than ⅛ of the minimum wavelength in a predetermined frequency range of a signal propagating through an insulating layer of said printed circuit board.

7. The compact via transmission line for the printed circuit board according to claim 2, wherein an electric field and a magnetic field of a principal electromagnetic wave propagating on said printed circuit board are in a direction perpendicular to a propagation direction, the electric field and the magnetic field being at right angles to each other.

8. A design method of a compact via transmission line for a printed circuit board comprising a central conductor which forms an inner conductor boundary of the compact via transmission line for the printed circuit board provided on the printed circuit board, and through which a signal transmits, a plurality of ground via holes which form an outer conductor boundary of said compact via transmission line, and a ground plate formed of a conductor layer of said printed circuit board connected to the ground via holes, wherein a constitutive parameter adjustment via hole for adjusting a constitutive parameter of said printed circuit board is provided between said inner conductor boundary and said outer conductor boundary, and air vents are further formed between said inner conductor boundary and said outer conductor boundary to excavate said printed circuit board.

9. The design method of the compact via transmission line for the printed circuit board according to claim 8, wherein said air vents are provided on said printed circuit board to adjust characteristic impedance of a via transmission line provided on said printed circuit board and an interconnected circuit connected to the via transmission line.

10. The design method of the compact via transmission line for the printed circuit board according to claim 9, wherein an electric field and a magnetic field of a principal electromagnetic wave propagating on said printed circuit board are in a direction perpendicular to a propagation direction, the electric field and the magnetic field being at right angles to each other.

11. The design method of the compact via transmission line for the printed circuit board according to claim 8, wherein the maximum dimension of cross-sectional shapes of said air vents is not more than $\frac{1}{8}$ of the minimum wavelength in a predetermined frequency range of a signal propagating through an insulating layer of said printed circuit board.

* * * * *